United States Patent [19]

Nishiyama

[11] Patent Number: 5,317,200
[45] Date of Patent: May 31, 1994

[54] PHASE SHIFT CIRCUIT APPARATUS
[75] Inventor: Seiichi Nishiyama, Kanagawa, Japan
[73] Assignee: Sony Corporation, Tokyo, Japan
[21] Appl. No.: 952,656
[22] Filed: Sep. 28, 1992
[30] Foreign Application Priority Data Sep. 30, 1991 [JP] Japan .................................. 3-278787
Sep. 30, 1991 [JP] Japan .................................. 3-278788

[51] Int. Cl.$^5$ ......................... H03K 5/00; H03L 7/00; H03L 7/06
[52] U.S. Cl. ..................................... 307/262; 328/55; 328/155; 307/511
[58] Field of Search .................. 328/55, 155; 307/262, 307/511

[56] References Cited

U.S. PATENT DOCUMENTS 4,663,594  5/1987  Perkins ................................. 328/155
4,737,703  4/1988  Hayakawa ........................... 328/155
4,782,246  11/1988 Kuroyanagi et al. ................ 328/155

Primary Examiner—John Zazworsky
Attorney, Agent, or Firm—Hill, Steadman & Simpson

[57] ABSTRACT

In a phase shift circuit apparatus, first and second currents, produced by dividing signal current at a predetermined ratio by a variable bias voltage, are respectively supplied to fifth and eighth transistors which constitute the second differential amplification means, and the first and the second currents are respectively divided at predetermined ratios to supply currents, including square components; third, fourth, fifth and sixth currents which are caused to flow through fifth and sixth transistors of the third differential amplification means and seventh and eighth transistors of the fourth differential amplification means, respectively. Seventh and eighth currents which, produced by dividing signal current at predetermined ratios, are supplied to the ninth and the tenth transistors or the eleventh and the twelfth transistors from the first and the second connection nodes, respectively. In this event, currents which are first and second divided sum currents including square components at predetermined ratio are provided to the first and the second load resistances, and at the fourth connection node there is developed an output voltage by composing the first connection node voltage, which leads the input signal by a phase angle of 45°, with the second connection node voltage which lags the input signal by a phase angle of 45°, and the gain of the output is substantially constant within a variable range of phase.

5 Claims, 15 Drawing Sheets

PHASE SHIFT CIRCUIT APPARATUS

BACKGROUND OF THE INVENTION

1. Field of the Invention

The present invention relates to a phase shift circuit, and may be suitably applied to an automatic phase control circuit, which is used in a television receiver, video tape recorder, and camera, for example.

2. Description of the Prior Art

FIG. 1 illustrates a conventional automatic phase control circuit 1 which automatically phase controls chrominance signals of video signals transmitted according to NTSC (National Television System Committee) or PAL (Phase Alternation by Line). In the automatic phase control circuit 1, a phase shift circuit 2 outputs continuous wave signals (hereinafter referred to as CW signals), which are inputted to a multiplier circuit 3, where CW signals and burst signals S1 are multiplied and then outputted to a voltage controlled oscillator 5 through a lag-lead filter circuit 4.

In the voltage controlled oscillator 5, a quartz oscillator output S2 is shifted in phase by an output voltage ΔV which has been inputted from the lag-lead filter circuit 4, so that the oscillation frequency of the quartz oscillator may be modified.

In the automatic phase control circuit 1, the output CW signals S3 having the modified oscillation frequency are fed back from the voltage controlled oscillator 5 to the phase shift circuit 2 through a low pass filter 6, so that the oscillation frequency of the quartz oscillator is made equal to the frequency of the burst signals.

In the automatic phase control circuit 1, output signals S3 are shifted 90° in phase through a 90° shift circuit 7, and CW signals which are 180 degrees out of phase with burst signals S1 are outputted as carrier signals of the B-Y axis through a buffer 8. Furthermore, output CW signals S3 which are in phase with the output of the low pass filter 6 are outputted as carrier signals of R-Y axis through a buffer 9.

The phase shift circuit 2 and an equivalent circuit thereof are shown in FIGS. 2 and 3, respectively. As shown in FIG. 2, a bias voltage ΔV of one of the transistor pair which constitutes a differential amplification circuit is variable, and therefore the ratio between currents I1 and I2 which flow through transistors Q1 and Q2, respectively, are controlled (0<k<1) so that the phase of the CW signals outputted from the output terminal P0 may be shifted within a range of ±45° with the input signals.

The collectors of the transistors Q1 and Q2 are supplied with source voltage Vcc through load resistances R1 and R2, respectively. A buffer transistor Q3 is connected to a connection node P1 between the transistor Q1 and the load resistance R1. The buffer transistor Q3 is connected at the emitter to a current source 10, and a capacitor C1 is connected between the output terminal P0 and a connection node P2 of the emitter and the current source 10.

As the phase is shifted in such a fashion, the output gain of CW signals outputted from the output terminal P0 linearly varies (FIG. 4).

When the output gain is to be 0 [dB] at a current ratio k of ½ as shown by broken line in FIG. 4, the output gain becomes larger as current ratio k reaches to 0 or 1, and the maximum 3 [dB] gain largely varies. When the output gain largely changes, the multiplication output from the multiplier circuit 3 however increases in distortion factor, with the result that the demodulation axis is deviated from the ideal demodulation axis.

More specifically, as illustrated in FIG. 5 the multiplier circuit 3 includes differential amplification circuits 10 and 11, which are constituted by a pair of transistors Q5 and Q6, and Q7 and Q8, respectively. Transistors Q9 and Q10 are connected to and input burst signals S1 to common emitters of transistors Q5 and Q6, and Q7 and Q8, respectively. The common emitters of the transistors Q9 and Q10 are connected to a current source 13 through a switching circuit 12 which makes switching operation by a burst gate pulse BG. To cause the differential amplification circuits 10 and 11 of the multiplier circuit 3 to perform switching operation, a voltage of 5 $V_T(=130\ [mV])$ is necessary as the input amplitude of the transistors Q5 to Q8. In the case where CW signals outputted from the phase shift circuit 2 are rather small in amplitude, the differential amplification circuits 10 and 11 are, therefore, not correctly operated, and there is thus a problem such that it is not possible to produce CW signals having ±90° shift with burst signals at a good accuracy.

Also when CW signals are excessively large in amplitude, the distortion factor of the output gain increases in phase shifting. Furthermore, in this case the influences of base-collector capacitance $C_{BC}$ of the transistors Q5 to Q8 becomes excessively large, and this generates distortion in the waveform of the multiplication output, so that demodulation axes are deviated θ from ideal B-Y and R-Y axes (FIG. 6). When in FIG. 6 the deviation angle θ of the B-Y axis is corrected, the variable range of the hue by the phase shift circuit 2 becomes 45°−θ, and is therefore narrowed by the deviation θ.

To avoid this disadvantage, a phase shift circuit 14 as shown in FIG. 7 has been proposed. In this phase shift circuit 14, a differential amplification circuit 15 which is constituted by a pair of pnp transistors is respectively connected to a connection node between load resistance R11 and the transistor Q11, and another connection node between resistance R12 and the transistor Q12 to produce negative signal voltage, and thereby the variable range of the phase to input signals is enlarged outside ±45°. In this case, there is however a disadvantage in that the output gain due to the phase shifting becomes larger by 10 [dB] at maximum than the gain at k=½ as shown in FIG. 8.

OBJECTS AND SUMMARY OF THE INVENTION

Accordingly, it is an object of the present invention to provide a phase shift circuit which is capable of producing output signals having a predetermined amplitude irrespective of any change in phase of the phase shift circuit.

It is another object of the present invention to provide a phase shift circuit which is capable of achieving variable control of phase beyond ±45° by a single capacity.

In view of these and other objects, a first aspect of the present invention is directed to a phase shift circuit apparatus which comprises: first differential amplification means 21 including first and second transistors Q21 and Q22 having common emitters adapted for receiving an input signal Is; second differential amplification means 22 including third and fourth transistors Q23 and Q24 having common emitters adapted for receiving the input signal Is; third differential amplification means 23 including fifth and sixth transistors Q27 and Q28 having common emitters connected to a collector of the third transistor Q23 of the second differential amplification means 22; fourth differential amplification means 24 including seventh and eighth transistors Q29 and Q30 having common emitters connected to a collector of the fourth transistor Q24 of the second differential amplification means 22; a first load resistance R21 connected to the fifth transistor Q27; a second load resistance R22 connected to the eighth transistor Q30, the first and second load resistance R21 and R22 being connected to a reference voltage source Vcc; fifth differential amplification means 25 including ninth and tenth transistors Q31 and Q32 having common emitters adapted for receiving signals $\alpha \cdot Is$ predetermined times as large as the input signal Is, the ninth and tenth transistors Q31 and Q32 having collectors connected to respective connection nodes between the third differential amplification means 23 and the third transistor Q23 and between the fourth differential amplification means 24 and the fourth transistor Q24 for producing a negative signal voltage; an eleventh transistor Q25 cascode connected to a collector of the first transistor Q21, and connected to a third connection node P23 between the first load resistance R21 and the fifth transistor Q27; a twelfth transistor Q26 cascode connected to a collector of the second transistor Q22, and connected to a fourth connection node P25 between the second load resistance R22 and the eighth transistor Q30; a buffer transistor Q33 having a base connected to a fifth connection node between the third connection node P23 and the fifth transistor Q27, the buffer transistor Q33 having an emitter connected to a current source 26; and a phase element C21 having one terminal connected to a sixth connection node P24 between the buffer transistor Q33 and the current source 26, the other terminal thereof connected to a seventh connection node P26 between the sixth connection node 24 and the eighth transistor Q30; and wherein: the first, the third and the ninth transistors Q21, Q23 and Q31 being adapted to be driven by a predetermined bias voltage V1; the second, the fourth and the tenth transistors Q22, Q24 and Q30 being adapted to be driven by a variable bias voltage (V1+$\Delta$V); the fifth and the seventh transistors Q27 and Q29 are adapted to be driven by a voltage at a connection node between the first and the eleventh transistors Q21 and Q25; the sixth and the eighth transistors Q28 and Q30 are adapted to be driven by a voltage at a connection node between the second and the twelfth transistors Q22 and Q26; and the input signal Is provided to the first and the second differential amplification means 21 and 22 is outputted from the seventh connection node 26 with a phase shifted.

In the present invention, first and second currents $k \cdot Is$ and $(1-k) \cdot Is$ respectively flow into the third and the fourth transistors which constitute the second differential amplification means, the first and the second currents $k \cdot Is$ and $(1-k) \cdot Is$ being produced by dividing signal current Is at a predetermined ratio $k:(1-k)$ according to the variable bias voltage $\Delta V$. An input signal $\alpha \cdot Is$ which has been produced by weighting the input signal Is by a predetermined factor $\alpha$ is divided at a predetermined ratio $(1-k):k$ into third and fourth currents $(1-k) \cdot \alpha \cdot Is$ and $k \cdot \alpha \cdot Is$. The third and the fourth currents flow from the fifth differential amplification means into the connection node between the third transistor and the third differential amplification means and the connection node between the fourth transistor and the fourth differential amplification means, respectively. Currents $(k - \alpha(1-k)) \cdot Is$ and $((1-k) - \alpha k) \cdot Is$ which have been produced by subtracting corresponding negative signals from the first and the second currents are supplied to the third and the fourth differential amplification means, respectively. The current $(k - \alpha(1-k)) \cdot Is$ is further divided at a ratio $(1-k):k$ into fifth and sixth currents $(1-k)(k - \alpha(1-k)) \cdot Is$ and $k(k - \alpha(1-k)) \cdot Is$, which each includes a square component. The fifth and the sixth currents flow into the fifth and the sixth transistors of the third differential amplification means, respectively. On the other hand, the current $((1-k) - \alpha k) \cdot Is$ is also divided at the same ratio into seventh and eighth currents $(1-k)((1-k) - \alpha k) \cdot Is$ and $k((1-k) - \alpha k) \cdot Is$ also including a square component. The seventh and eighth currents flow into the seventh and the eighth transistors of the fourth differential amplification means, respectively. Ninth and tenth currents $k \cdot Is$ and $(1-k) \cdot Is$ respectively flow from connection nodes into the eleventh and the twelfth transistors, the ninth and the tenth currents $k \cdot Is$ and $(1-k) \cdot Is$ being produced by dividing signal current Is at a predetermined ratio $k:(1-k)$. First and second sum current $(1-(1+\alpha)(1-k)^2) \cdot Is \cdot R$ and $(1-(1+\alpha) k^2) \cdot Is \cdot R$ therefore flow through the first and the second load resistances, the first and the second sum current including square components of the coefficient k and negative signal components, respectively. The seventh connection node provides an output having a substantially constant gain for a phase shift outside a range of $\pm 45°$ to the input signal Is.

Furthermore, the first and the second currents $k \cdot Is$ and $(1-k) \cdot Is$ respectively flow into the third and the fourth transistors which constitute the second differential amplification means, the first and the second currents $k \cdot Is$ and $(1-k) \cdot Is$ being produced by dividing signal current Is at a predetermined ratio $k: (1-k)$ according to the variable bias voltage (V1+$\Delta$V). The first current $k \cdot Is$ is further divided at a predetermined ratio $(1-k):k$ into third and fourth currents $(1-k) \cdot k \cdot Is$ and $k^2 \cdot Is$ which include square components. The third and the fourth currents respectively flow into the fifth and the sixth transistors which are connected to the third transistor and constitute the third differential amplification means. On the other hand, also the second current $(1-k) \cdot Is$ is further divided at a predetermined ratio $(1-k):k$ into fifth and sixth currents $(1-k)^2 \cdot Is$ and $k(1-k) \cdot Is$ which include square components. The fifth and the sixth currents respectively flow into the seventh and the eighth transistors which are connected to the fourth transistor and constitute the fourth differential amplification means. Seventh and eighth currents $k \cdot Is$ and $(1-k) \cdot Is$ which have been produced by dividing signal current Is at the predetermined ratio $k:(1-k)$ are supplied to the ninth and the tenth transistors or the eleventh and the twelfth transistors from the first and the second connection nodes, respectively. In this event, first and second sum currents $(1-(1-k)^2) \cdot Is$ and $(1-k)^2 \cdot Is$ including square components of the predetermined ratio k flow through the first and the second load resistances, respectively, and therefore at the fourth connection node there is developed an output voltage by composing the first connection node voltage, which leads the input signal by a phase angle of 45°, with the second connection node voltage which lags the input signal by a phase angle of 45°, and the gain of the output is substantially constant within a variable range of phase.

Another aspect of the present invention is directed to a phase shift circuit apparatus which comprises: first differential amplification means 41 including first and second transistors Q41 and Q42 having common emitters adapted for receiving an input signal Is; second differential amplification means 42 including third and fourth transistors Q43 and Q44 having common emitters adapted for receiving the input signal Is; third differential amplification means 43 including fifth and sixth transistors Q47 and Q48 having common emitters connected to a collector of the third transistor Q43 of the second differential amplification means 42; fourth differential amplification means 44 including seventh and eighth transistors Q49 and Q50 having common emitters connected to a collector of the fourth transistor Q44 of the second differential amplification means 42; a first load resistance R41 connected to the fifth transistor Q47; a second load resistance R42 connected to the eighth transistor Q50, the first and second load resistance R41 and R42 being connected to a reference voltage source Vcc; fifth differential amplification means 51 for producing negative signal voltages $(1-k)\cdot a\cdot Is$ and $k\cdot a\cdot Is$ and including ninth and tenth transistors Q54 and Q55 having common emitters adapted to be drawn currents $(-a\cdot Is)$ predetermined times as large as the input signal Is, the ninth and tenth transistors Q54 and Q55 having collectors connected to the reference voltage source Vcc through first and second constant current sources 52 and 53, a first connection node between the first constant current source 52 and the collector of the ninth transistor Q54 being connected to a connection node P41 between the third differential amplification means 43 and the third transistor Q43 whereas a second connection node between the second constant current source 53 and the collector of the tenth transistor Q55 is connected to a connection node P42 between the fourth differential amplification means 44 and the fourth transistor Q44; an eleventh transistor Q45 cascode connected to a collector of the first transistor Q41, and connected to a fifth connection node P43 between the first load resistor R41 and the fifth transistor Q47; a twelfth transistor Q46 cascode connected to a collector of the second transistor Q42, and connected to a sixth connection node P45 between the second load resistor R42 and the eighth transistor Q50; a buffer transistor Q53 having a base connected to a seventh connection node between the fifth connection node P43 and the fifth transistor Q47, the buffer transistor Q53 having an emitter connected to a current source 46; and a phase element C41 having one terminal connected to an eighth connection node P44 between the buffer transistor Q53 and the current source 46, the other terminal thereof connected to a ninth connection node P46 between the sixth connection node P45 and the eighth transistor Q50; and wherein: the first, the third and the ninth transistors Q41, Q43 and Q54 being adapted to be driven by a predetermined bias voltage V1; the second, the fourth and the tenth transistors Q42, Q44 and Q55 being adapted to be driven by a variable bias voltage $(V1+\Delta V)$; the fifth and the seventh transistors Q47 and Q49 are adapted to be driven by a voltage at a connection node between the first and the eleventh transistors Q41 and Q45; the sixth and the eighth transistors Q48 and Q50 are adapted to be driven by a voltage at a connection node between the second and the twelfth transistors Q42 and Q46; and the input signal provided to the first and the second differential amplification means 41 and 44 is outputted from the ninth connection node with a phase shifted.

The phase shift circuit apparatus according to the third aspect of the present invention may comprises: quartz oscillation means including a quartz oscillator and connected to the first, the second, and the fifth differential amplification means (21, 22 and 25), (41, 42 and 51), (61, 62 and 65) for supplying oscillated output, as the input signal Is, from the quartz oscillator; and filtering means for outputting an output voltage, and wherein the variable bias voltage may be controlled on the basis of the output voltage from the filtering means so that the oscillation frequency of the quartz oscillator is controlled to a predetermined frequency.

According to the fourth aspect of the present invention, there is provided a phase shift circuit which comprises: first differential amplification means 81 including first and second transistors Q81 and Q82 having common emitters adapted for receiving an input signal Is; second differential amplification means 82 including third and fourth transistors Q83 and Q84 having common emitters adapted for receiving the input signal Is; third differential amplification means 83 including fifth and sixth transistors Q87 and Q88 having common emitters connected to a collector of the third transistor 83 of the second differential amplification means 82; fourth differential amplification means 84 including seventh and eighth transistors Q89 and Q90 having common emitters connected to a collector of the fourth transistor Q84 of the second differential amplification means 82; a first load resistor R81 connected to the fifth transistor Q87; a second load resistor connected to the eighth transistor Q90, the first and second load resistors being connected to a reference voltage source Vcc; a ninth transistor Q85 cascode connected to a collector of the first transistor Q81, and connected to a first connection node P81 between the first load resistor R81 and the fifth transistor Q87; a tenth transistor Q86 cascode connected to a collector of the second transistor Q82, and connected to a second connection node P83 between the second load resistor R82 and the eighth transistor Q90; a buffer transistor Q91 having a base connected to the first connection node P81 and having an emitter connected to a current source 85; and a phase element C81 having one terminal connected to a third connection node between the buffer transistor Q91 and the current source 85, the other terminal thereof connected to a fourth connection node P84 between the second connection node P83 and the eighth transistor Q90; and wherein: the first and the third transistors Q81 and Q83 being adapted to be driven by a predetermined bias voltage V1; the second and the fourth transistors Q82 and Q84 being adapted to be driven by a variable bias voltage $(V1+\Delta V)$; the fifth and the seventh transistors Q87 and Q89 are adapted to be driven by a voltage at a connection node between the first and the ninth transistors Q81 and Q85; the sixth and the eighth transistors Q88 and Q90 are adapted to be driven by a voltage at a connection node between the second and the tenth transistors Q82 and Q86; and the input signal Is provided to the first and the second differential amplification means 81 and 82 is outputted from the fourth connection node P84 with a phase shifted.

A fifth aspect of the present invention is directed to a phase shift circuit apparatus which comprises: first differential amplification means 101 including first and second transistors Q101 and Q102 having common emitters adapted for receiving an input signal Is; second differential amplification means 102 including third and fourth transistors Q103 and Q104 having common emitters adapted for receiving the input signal Is; third differential amplification means 103 including fifth and sixth transistors 107 and 108 having common emitters connected to a collector of the third transistor Q103 of the second differential amplification means 102; fourth differential amplification means 104 including seventh and eighth transistors Q109 and Q110 having common emitters connected to a collector of the fourth transistor Q104 of the second differential amplification means 102; a first load resistor 101 connected to the fifth transistor 107; a second load resistor 102 connected to the eighth transistor 110, the first and second load resistor 101 and 102 being connected to a reference voltage source Vcc; a ninth transistor Q105 cascode connected to a collector of the first transistor Q101, and connected to the reference voltage source Vcc; a tenth transistor Q106 cascode connected to a collector of the second transistor Q102, and connected to the reference voltage source Vcc; fifth differential amplification means 111 including eleventh and twelfth transistors Q112 and Q113 having common emitters adapted for receiving the input signal Is, the eleventh transistor Q112 having a collector connected to a first connection node P101 between the first load resistor 101 and the fifth transistor Q107 whereas the twelfth transistor Q113 includes a collector connected to a second connection node P103 between the second load resistance 102 and the eighth transistor Q110; a buffer transistor Q111 having a base connected to the first connection node P101, the buffer transistor having an emitter connected to a current source 105; and a phase element C101 having one terminal connected to a third connection node P102 between the buffer transistor 111 and the current source 105, the other terminal thereof connected to a fourth connection node P104 between the second connection node P103 and the eighth transistor Q110; and wherein: the first, the third and the eleventh transistors Q101, Q103 and Q112 being adapted to be driven by a predetermined bias voltage V1; the second, the fourth and the twelfth transistors Q102, Q104 and Q113 being adapted to be driven by a variable bias voltage (V1+ΔV); the fifth and the seventh transistors Q107 and Q109 are adapted to be driven by first voltage at a connection node between the first and the ninth transistors Q101 and Q105; the sixth and the eighth transistors Q108 and Q110 are adapted to be driven by second voltage at a connection node between the second and the tenth transistors Q102 and Q106; and the input signal Is provided to the first and the second differential amplification means 101 and 102 is outputted from the fourth connection node P104 with a phase shifted.

DESCRIPTION OF THE PREFERRED EMBODIMENTS

Figure 9:
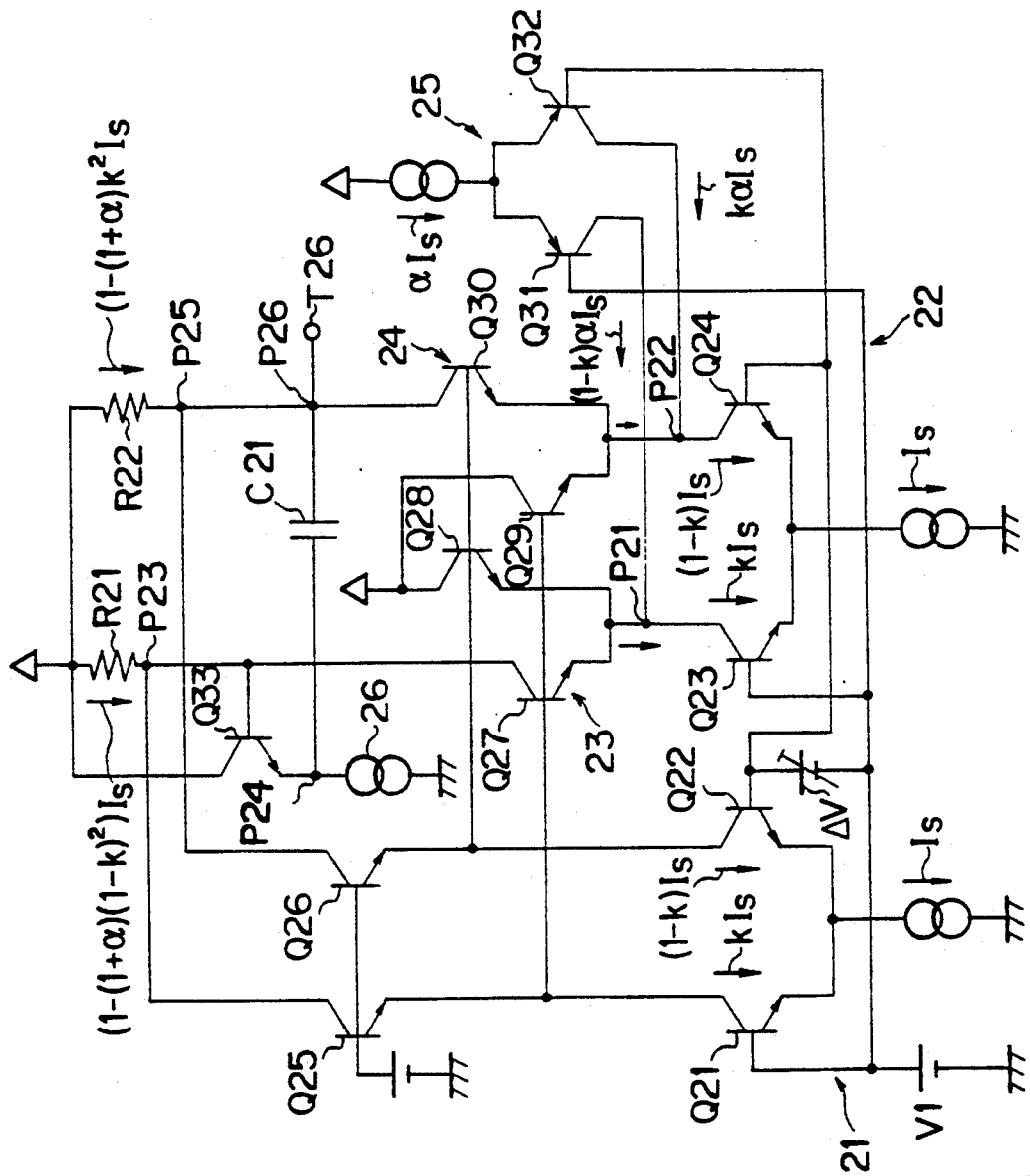
FIG. 9 illustrates a phase shift circuit as a first embodiment of the present invention.

Preferred embodiments of the present invention will be described with reference to the accompanying drawings:

A first embodiment of the present invention is illustrated in FIG. 9, in which a phase shift circuit 20 includes first and second differential amplification circuits 21 and 22. The first differential amplification circuit 21 is constituted by a pair of npn transistors Q21 and Q22 while the second differential amplification circuit 22 another pair of npn transistors Q23 and Q24. Common emitters of transistors Q21, Q22 and Q23, Q24 are provided with equal signal currents Is. The bases of the transistors Q21 and Q23 are supplied with a bias voltage V1 while the bases of the transistors Q22 and Q24 a variable bias voltage (V1+ΔV). Collector current k·Is which is k times as large as signal current Is flows through the transistors Q21 and Q23 while collector current (1−k)·Is which is (1−k) times as large as the signal current Is flows through the transistors Q22 and Q24 (0<k<1).

Fixed bias transistors Q25 and Q26 are cascode connected to the collectors of the transistors Q21 and Q22. The collectors of the transistors Q23 and Q24 of the second differential amplification circuit 22 are connected to third and fourth differential amplification circuits 23 and 24, respectively. The third and fourth differential amplification circuits 23 and 24 are constituted by pairs of transistors Q27, Q28 and Q29, Q30, respectively. The transistors Q27 and Q29 are driven by a voltage of the connection node of the transistors Q21 and Q25 constituting the first differential amplification circuit 21. The transistors Q28 and Q30 are driven by a voltage of the transistors Q22 and Q26 constituting the first differential amplification circuit 21. A fifth differential amplification circuit 25 is connected to a connection node P21 between the collector of the transistor Q23 of the second differential amplification circuit 22 and the third differential amplification circuit 23 as well as a connection node P22 between the collector of the transistor Q24 and the fourth differential amplification circuit 24.

The fifth differential amplification circuit 25 is constituted by a pair of npn transistors Q31 and Q32, and the collectors of the transistors Q31 and Q32 are connected to the common emitters of the third and fourth differential amplification circuits 23 and 24 at connection nodes P21 and P22, respectively. The emitters of the transistors Q31 and Q32 are supplied from a reference voltage source $\alpha \cdot Is$ which is $\alpha$ times as large as the signal current Is. The transistor Q31 is provided at the base thereof with a bias voltage V1 whereas the transistor Q32 is supplied at the base thereof with a variable bias voltage $(V1 + \Delta V)$. With such a construction, collector currents $(1-k)\cdot\alpha\cdot Is$ and $k\cdot\alpha\cdot Is$ flow into the connection nodes P21 and P22, respectively. The collector currents $(1-k)\cdot\alpha\cdot Is$ and $k\cdot\alpha$ Is are $(1-k)$ times and k times as large as signal current $\alpha\cdot Is$, respectively.

Since collector current which flows into the transistor Q23 of the second differential amplification circuit 22 is $k\cdot Is$, signal current $(k-(1-k)\cdot\alpha)\cdot Is$ is supplied to the third differential amplification circuit 23. The signal current is smaller by collector current $(1-k)\cdot\alpha\cdot Is$, which flows from the fifth differential amplification circuit 25, than the collector current $k\cdot Is$. The collector current which flows into the transistor Q24 of the second differential amplification circuit 22 is $(1-k)\cdot Is$, and the fourth differential amplification circuit 24 is supplied with signal current $((1-k)-\alpha\cdot k)\cdot Is$. This signal current $((1-k)-\alpha\cdot k)\cdot Is$ is smaller by collector current $k\cdot\alpha\cdot Is$ than the collector current $(1-k)\cdot Is$. Collector currents $(k(1-k)-\alpha\cdot(1-k)^2)\cdot Is$ and $(k^2 - k(1-k)\cdot\alpha)\cdot Is$ flow through the pair of transistors Q27 and Q28 of the third differential amplification circuit 23, respectively, the former collector current being divided from the signal current $(k-(1-k)\cdot\alpha)\cdot Is$ with a factor of $(1-k)$ whereas the latter is divided from the signal current $(k-(1-k)\cdot\alpha)\cdot Is$ with a factor of k. Collector currents $((1-k)^2 - \alpha\cdot k(1-k))\cdot Is$ and $(k(1-k)-\alpha\cdot k^2)\cdot Is$ flow through the pair of transistors Q29 and Q30 of the fourth differential amplification circuit 24, respectively, the former collector current being divided from the signal current $((1-k)-\cdot\alpha k)$ Is with a factor of $(1-k)$ whereas the latter is divided from the signal current $((1-k)^2 - \cdot\alpha\cdot k^2)\cdot Is$ with a factor of k.

The transistors Q28 and Q29 are each connected at the collector thereof to the common voltage supply Vcc.

The transistor Q27 of the third differential amplification circuit 23 is connected at the collector thereof to the voltage supply Vcc through a resistance R21. A connection node P23 between the resistance R21 and the transistor Q27 is connected to the collector of the transistor Q25 of the first differential amplification circuit 21. Thus, sum current $(1-(1+\alpha)(1-k)^2))\cdot Is$ which flows through the transistors Q25 and Q27 flows through the resistance R21. A buffer transistor Q33 is connected to the connection node P23, and voltage $(1-(1+\alpha)(1-k)^2)\cdot Is\cdot R$ is developed at a connection node P24 between the transistor Q33 and the current source 26.

The transistor Q30 of the fourth differential amplification circuit 24 is connected at the collector thereof to the voltage supply Vcc through a resistance R22. A connection node P25 between the resistance R22 and the transistor Q30 is connected to the collector of the transistor Q26 of the first differential amplification circuit 21. Thus, sum current $(1-(1+\alpha) K^2)\cdot Is$ which flows through the transistors Q26 and Q30 flows through the resistance R22. A voltage $(1-(1+\alpha)K^2)\cdot Is\cdot R$ is therefore developed at a connection node P25.

A capacitor C21 is connected between the connection node P24 and a connection node P26 between the collector of the transistor Q30 and the connection node P25.

Figure 10:
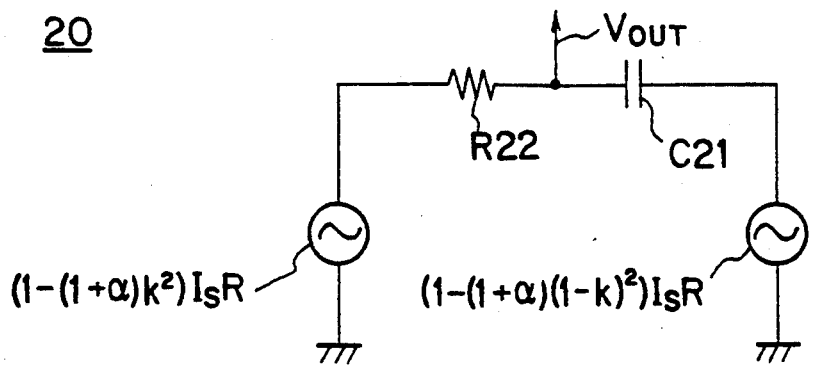
FIG. 10 shows a diagram of an equivalent circuit of an essential portion of the phase shift circuit shown in FIG. 9.

The equivalent circuit of the phase shift circuit 20 is shown as in FIG. 10. A signal voltage $(1-(1+\alpha)(1-K)^2)\cdot Is\cdot R$ is developed at the collector of the transistor Q27 of the third differential amplification circuit 23, and lags by 45° by the capacitor C21 and the resistance R22. A signal voltage $(1-(1+\alpha)K^2)\cdot Is\cdot R$ is developed at the collector of the transistor Q30 of the fourth differential amplification circuit 24, and leads by 45°. These signals are vector composed to output a voltage as an output Vout of the phase shift circuit 20.

Figure 1:
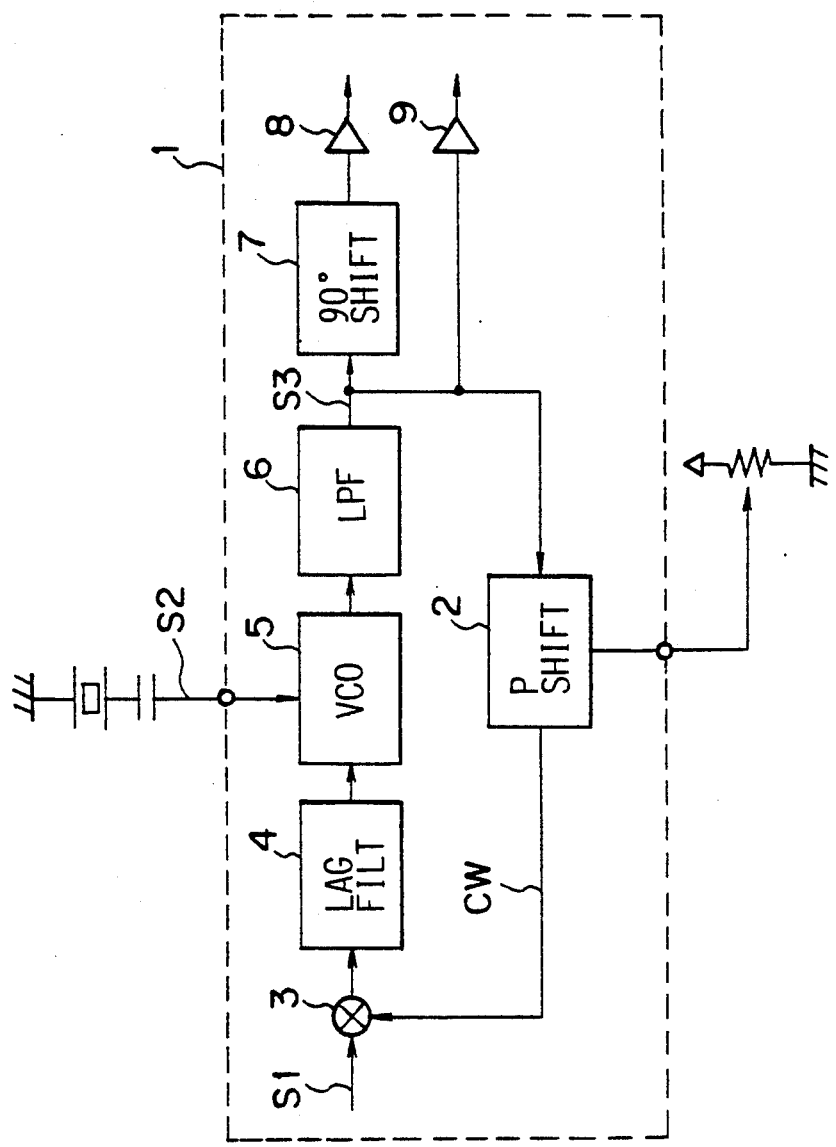
FIG. 1 illustrates a configuration of the automatic phase control circuit as a prior art.
Figure 2:
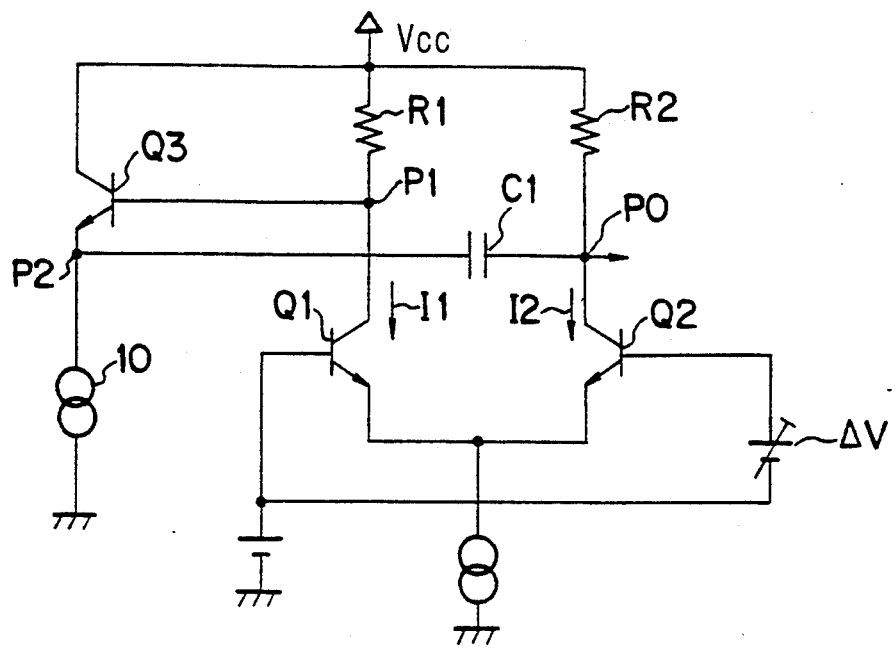
FIG. 2 shows the conventional phase shift circuit used in the automatic phase control circuit of FIG. 1.
Figure 3:
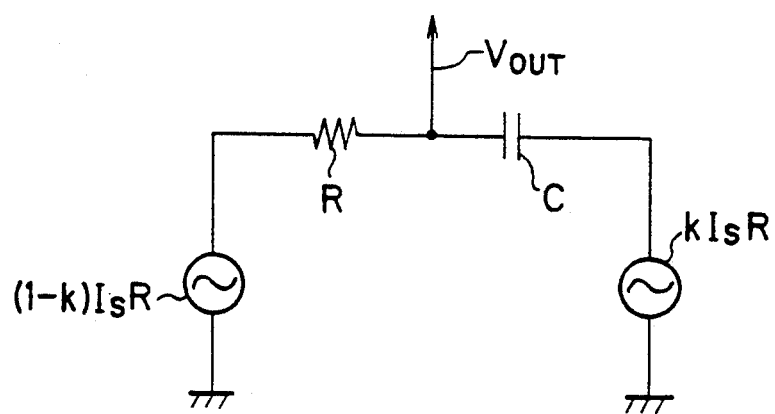
FIG. 3 is a connection diagram for illustrating an equivalent circuit of the conventional phase shift circuit shown in FIG. 2.
Figure 4:
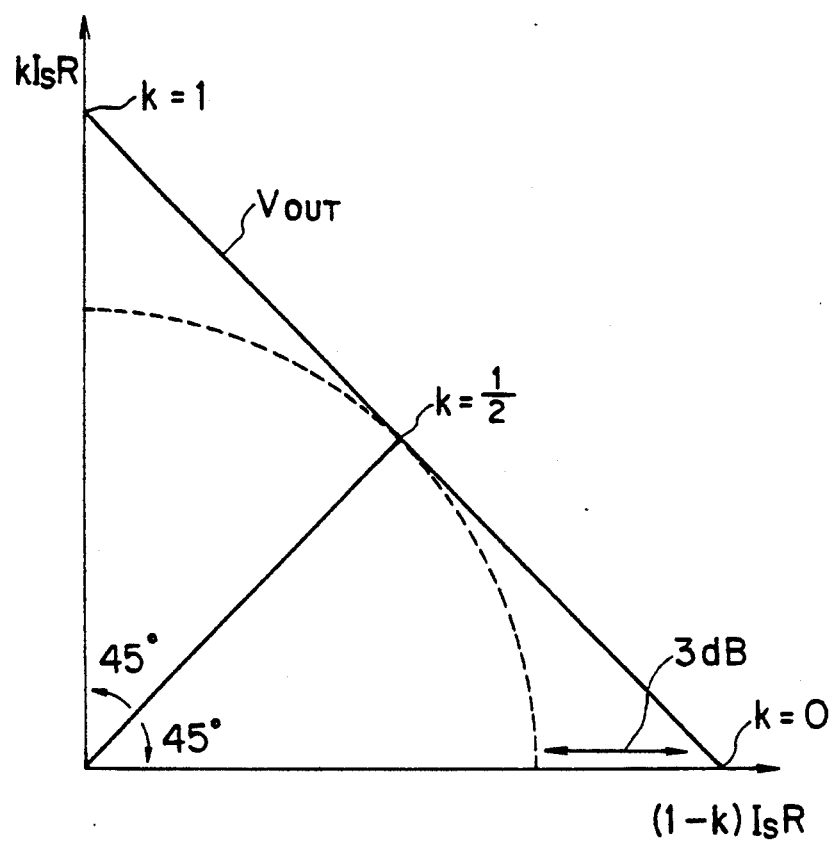
FIG. 4 is a characteristic graph showing the relationship between changes in phase and output gain of the conventional phase shift circuit shown in FIG. 2.

In such a configuration, the phase shift circuit 20 inputs signal current Is to the common emitters of the first and second differential amplification circuits 21 and 22 from the voltage controlled oscillator 5 through the low pass filter 6 of FIG. 1. The phase shift circuit 20 divides signal current Is at a ratio of $k:(1-k)$ at the transistor pair Q21 and Q22 of the first differential amplification circuit 21 and at the transistor pair Q23 and Q24 of the second differential amplification circuit 22. Furthermore, the phase shift circuit 20 divides signal current $(k(1-k) - \alpha(1-k)^2)\cdot Is$ at a ratio of $(1-k):k$ at the transistor pair Q27 and Q28 of the third differential amplification circuit 23, and signal current $((1-k)-\alpha\cdot k)\cdot Is$ also at a ratio of $(1-k):k$ at the transistor pair Q29 and Q30 of the fourth differential amplification circuit 24. Voltages $(1-(1+(1+\alpha)(1-k)^2)\cdot Is\cdot R$ and $(1-(1+\alpha)k^2)\cdot Is\cdot R$ are therefore developed at second and third connection nodes P23 and P25, respectively. The voltages $(1-(1+\alpha)(1-k)^2)\cdot Is\cdot R$ and $(1-(1+\alpha)k^2)\cdot Is\cdot R$ are in phase with the input signal current Is. The former leads and the latter lags by 45° by the resistance R22 and the capacitor 21, and a vector sum of the 45° lead and lag signal voltages is therefore developed at the output terminal T26. When k is changed from 0 to 1, these signal voltages vary from $-\alpha\cdot Is\cdot R$ to $Is\cdot R$, and negative voltages are therefore developed.

Figure 11:
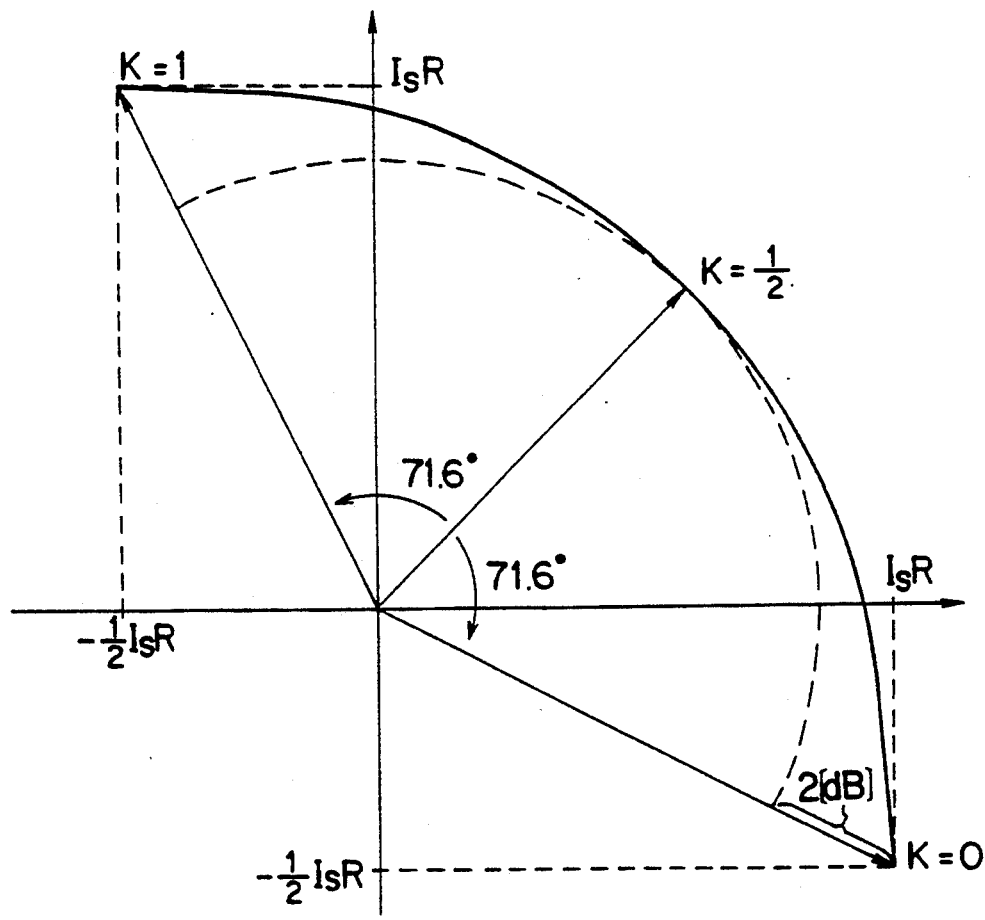
FIG. 11 is a characteristic graph showing the relationship between changes in phase and output gain in the essential portion of the phase shift circuit shown in FIG. 10.
Figure 12:
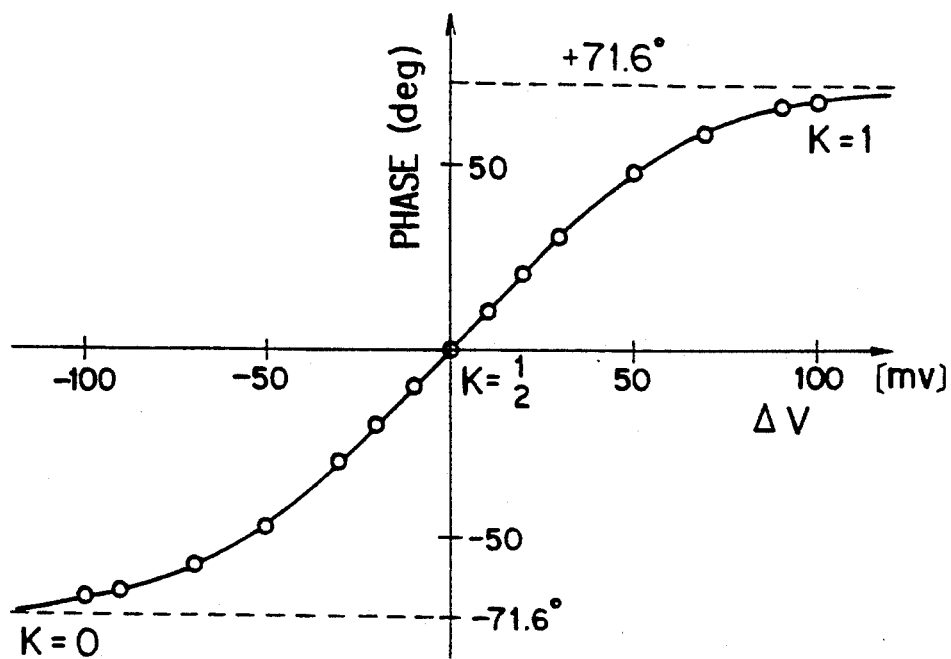
FIG. 12 is characteristic graph showing the relationship between control voltages and changes in phase of the phase shift circuit shown in FIG. 9.

In this embodiment, as shown by the solid line in FIG. 11 the locus of the gain by phase changing is variable in a range $\pm 71.6°$ with the phase of input signal $(k=\frac{1}{2})$ as the central axis when 45° lag signal voltage is plotted on x axis while 45° lead signal voltage is plotted on y axis. In this case, changes in phase are plotted in a characteristic curve, shown in FIG. 12, with changes in voltage taken along the axis of abscissa, and as shown in FIG. 13 changes in gain are plotted in a characteristic curve downwardly convex in which the gain is substantially zero within a range where control voltage $\Delta V$ is small.

Figure 13:
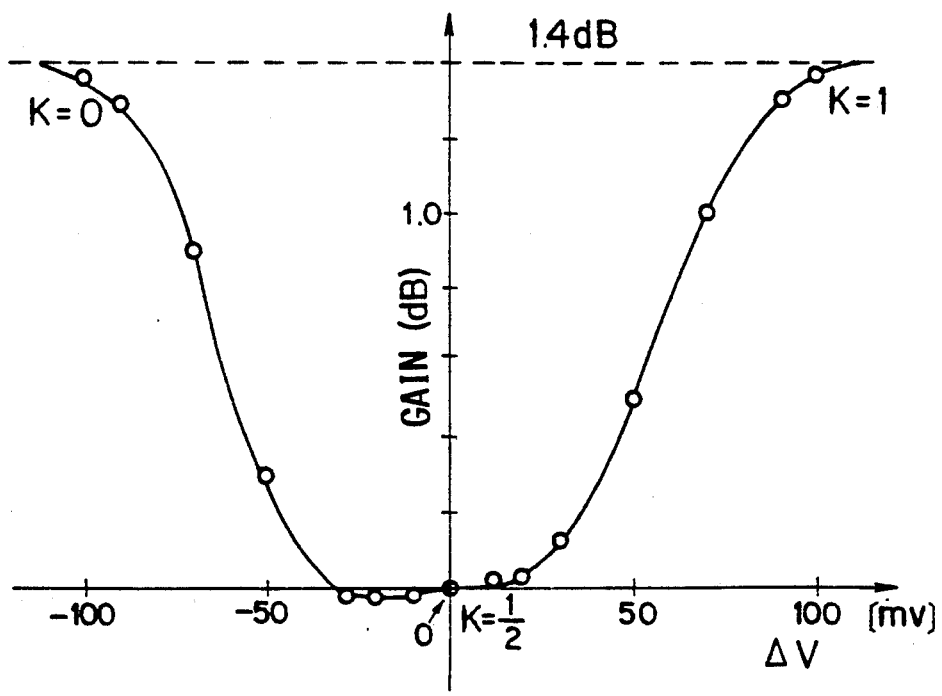
FIG. 13 is characteristic graph showing the relationship between control voltages and output gain of the phase shift circuit shown in FIG. 9.

As shown in FIG. 13, the output gain, developed to the connection node P26, is controlled within 1.4 [dB] at maximum ($k=0$ and $k=1$) when the gain is zero at $k=\frac{1}{2}$, and it is possible to effectively avoid a possibility such that changes in gain of about 10 [dB] may take place as in the prior art.

The output gain therefore becomes approximately equal to a gain in the case where the gain of the output voltage Vout is constant at any phase (shown by the broken line in FIG. 11), and particularly changes in gain in a range outside 45° can be controlled as small as possible. This makes it possible to effectively avoid a disadvantage of the prior art such that in the case where the phase of a signal of which signal amplitude is set to the optimum amplitude is shifted, distortion is produced in the signal amplitude due to an increase in gain. Furthermore, another disadvantage such that distortion is produced in the output amplitude due to incidental capacity $C_{BC}$ of the collectors of transistors Q5 to Q8 which constitute the multiplier circuit 3 may be also effectively removed. Moreover, it is possible to effectively remove a possibility that in the case where the phase of a signal of which signal amplitude is set to the optimum amplitude is shifted, the operation of each of the transistors Q5 to Q8 of the multiplier circuit 3 becomes unstable since the gain decreases.

According to this embodiment, an output voltage Vout of the phase shift circuit is given by a vector sum of a voltage $(1-(1+\alpha)(1-k)^2)\cdot Is\cdot R$ and a voltage $(1-(1+\alpha)k^2)\cdot Is\cdot R$, the former leading in phase the input signal by 45° while the latter lags by 45°. This enables that: in the case where the phase is shifted to a predetermined value, the output gain is kept substantially constant; the multiplier circuit 3 of the automatic phase control circuit is much reduced in error as compared to multiplier circuits of the prior art; and exact demodulation axes, B-Y axis and R-Y axis are provided to burst signals.

A second embodiment of the present invention will be described with reference to FIG. 14, in which the reference numeral 40 generally designates a phase shift circuit which has a configuration similar to the phase shift circuit 20 of FIG. 9 except that in place of the fifth differential amplification circuit 25 including the pnp transistor pair Q31 and Q32, a differential amplification circuit 51 including a npn transistor pair Q54 and Q55 is provided. Parts of the phase shift circuit 40 of FIG. 14 which are similar to those of the phase shift circuit 20 of FIG. 9 are indicated by reference numerals obtained by adding twenty to reference numerals of FIG. 9, and detailed descriptions thereof are therefore omitted.

In this embodiment, signal current $\cdot \alpha \cdot Is$ is drawn from the common emitters of the transistors Q54 and Q55. Source voltage Vcc is applied to the collectors of the transistors Q54 and Q55 through constant current sources 52 and 53, respectively. The bases of the transistors Q54 and Q55 are supplied with variable voltage (V1+$\Delta V$) and bias voltage V1, respectively. Collector currents $-(1-k)\cdot a\cdot Is$ and $-k\cdot \alpha \cdot Is$ flows through the collectors of the transistors Q54 and Q55, respectively, and currents $(1-k)\cdot \alpha \cdot Is$ and $-k\cdot \alpha \cdot Is$ are supplied to first and second connection nodes P41 and P42 from the collectors of the transistors Q54 and Q55, respectively.

With such a configuration, signal currents $(k-\alpha(1-k))\cdot Is$ and $((1-k)-\alpha\cdot k)\cdot Is$ are respectively supplied to the third and fourth differential amplification circuits 43 and 44 which are connected to the second differential amplification circuit 42. As in the first embodiment previously described, voltages $(1-(1+\alpha)(1-k)^2)\cdot Is\cdot R$ and $(1-(1+\alpha)k^2)\cdot Is\cdot R$ are developed at fourth and sixth connection nodes P44 and P46, respectively, and therefore a voltage is outputted to the connection node P46 with a substantially constant gain irrespective of any phase shift within a range of ±71.6° due to the variable bias voltage $\Delta V$.

Figure 14:
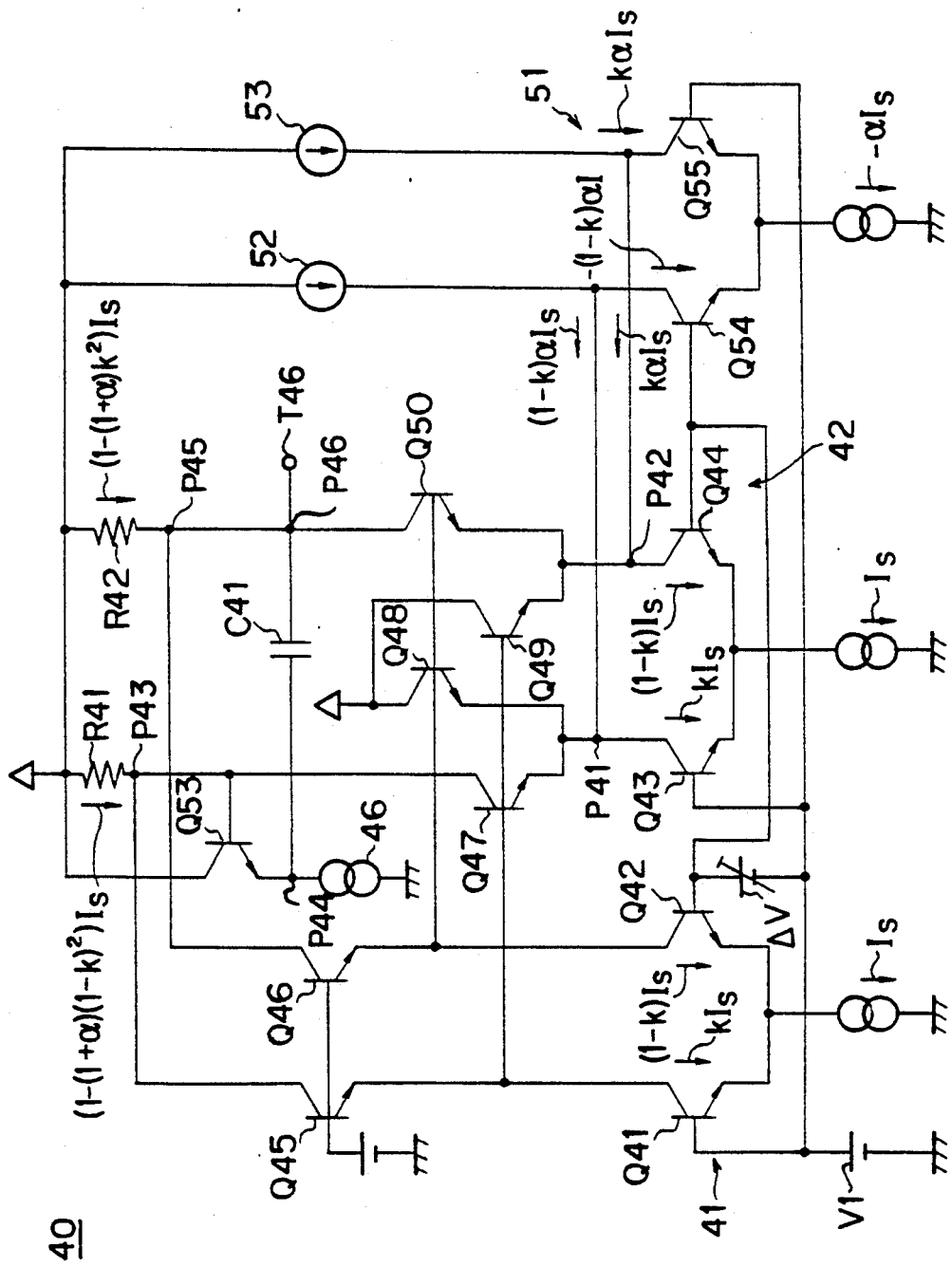
FIG. 14 is a connection diagram of a phase shift circuit as a second embodiment of the present invention.

According to the configuration of FIG. 14, the phage of each input signal may be controlled in a range outside 45° about that phase by setting the coefficient ($0<\alpha<1$), which produces a negative signal voltage, to a predetermined value. Furthermore, by such setting, change in gain within the variable range may be made substantially constant, and therefore fairly small as compared to change in gain conventionally achieved.

In the second embodiment, the first differential amplification circuit 41 is connected to the connection nodes P43 and P45, and currents $k\cdot Is$ and $(1-k)\cdot Is$ which are produced by dividing signal current Is at a ratio $k:(1-k)$ flow into the connection nodes P43 and P45, respectively. The present invention is not limited to such a case, and may be applied to various cases where currents $K\cdot Is$ and $(1-k)\cdot Is$ are caused to flow through other differential amplification means.

Figure 15:
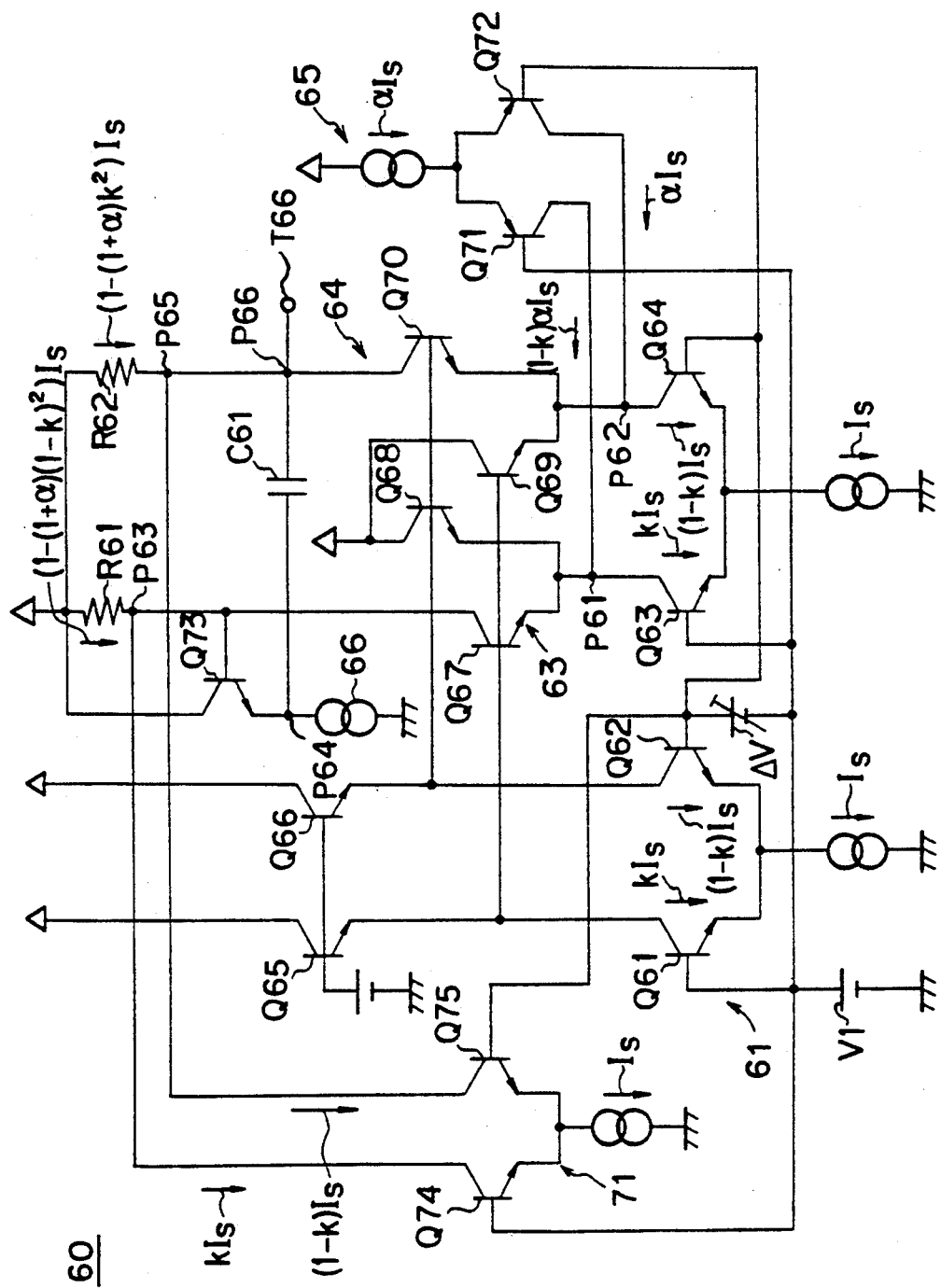
FIG. 15 is a connection diagram of a phase shift circuit as a third embodiment of the present invention.

FIG. 15 illustrates a phase shift circuit 60 as a third embodiment of the present invention. In FIG. 15, parts of the phase shift circuit 60 which are similar to those of the phase shift circuit 20 of FIG. 9 are indicated by reference numerals obtained by adding forty to reference numerals of FIG. 9, and detailed descriptions thereof are therefore omitted. The phase shift circuit 60 includes a differential amplification circuit 71, which is constituted by a pair of transistors Q74 and Q75. The collectors of the transistors Q74 and Q75 are connected to connection nodes P63 and P65, respectively. The bases of the transistors Q74 and Q75 are supplied with variable voltage (V1+$\Delta V$) and bias voltage V1, respectively, and the common emitters thereof are provided with signal current Is.

In this embodiment, the collectors of transistors Q65 and Q66 which are cascode connected to a first differential amplification circuit 61 are connected to voltage sources in place of branch points P63 and P65. As in the preceding embodiments, the phase of an output signal may be set at output terminal T66 in a range outside 45° about the input signal, and the same effect as that of the preceding embodiments may be achieved.

Figure 16:
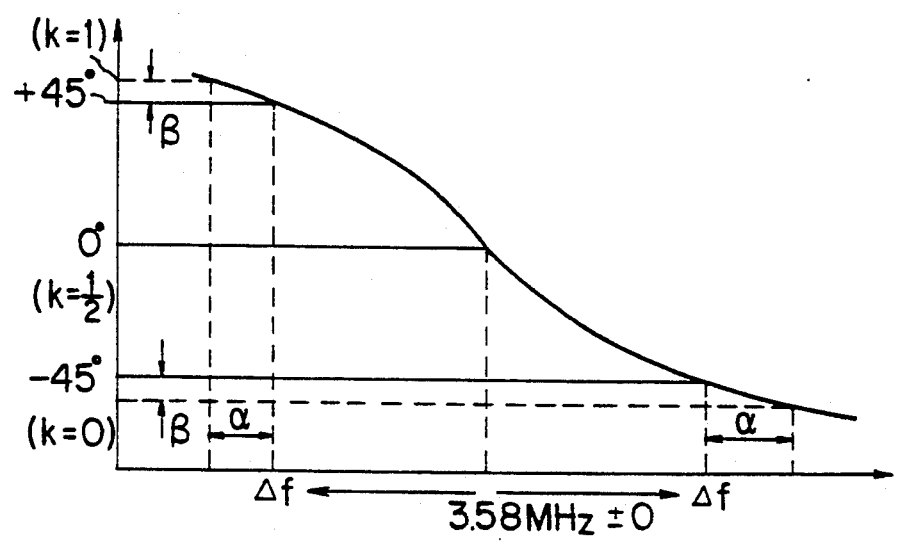
FIG. 16 is a phase vs. frequency characteristic graph for illustrating the operation of the phase shift circuit of FIG. 15 when the phase shift circuit is used in combination with a voltage controlled oscillation circuit.

In the embodiments previously described, the phase shift circuit is used in the variable phase shifter, but the present invention may be applied to a voltage controlled oscillation circuit, into which quartz oscillation output is inputted as signal current Is, and variable bias voltage $\Delta V$ is inputted from the lag lead filter circuit 4 of FIG. 1. In such a fashion, the oscillation frequency of the quartz oscillator is controlled to a predetermined frequency. As shown in FIG. 16, the oscillation frequency of the quartz oscillator may be set to a predetermined frequency within a fairly wide range as compared to the conventional case.

In the embodiments previously described, chrominance signal& are phase controlled in automatic phase control circuits, but the present invention may be applied in various phase shift circuits which achieve variable phase control of other kinds of signals.

In the third embodiment, the capacitor C61 is connected between the output terminal T66 and the connection node P64, but the present invention may be applied to a case where other phase elements are connected.

Furthermore, in the preceding embodiments, the present invention is applied to phase shift circuits shown in FIGS. 9, 14 and 15, but may be applied to various kinds of phase shift circuits in which a square element of the coefficient k and a negative voltage component are produced.

According to the present invention, first and second currents which have been produced by dividing signal current at a predetermined ratio by a variable bias voltage are respectively supplied to third and fourth transistors which constitute the second differential amplification means, and currents which have negative signal component superposed to the first and second currents are respectively divided at predetermined ratios to supply currents, including square components; third, fourth, fifth and sixth currents which are caused to flow through fifth and sixth transistors of the third differential amplification means and seventh and eighth transistors of the fourth differential amplification means, respectively. Currents which have been produced by dividing signal current at a predetermined ratio are supplied to the 11th and the 12th transistors from the first and the second connection nodes, respectively. In this event, currents which are first and second divided sum currents including a square component at predetermined ratio are provided to the first and the second load resistances, and therefore the 8th connection node provides an output to an input signal, the output having a phase shift larger than $+45°$ or smaller than $-45°$, and the gain of the output is substantially constant even if phase shift takes place.

Figure 17:
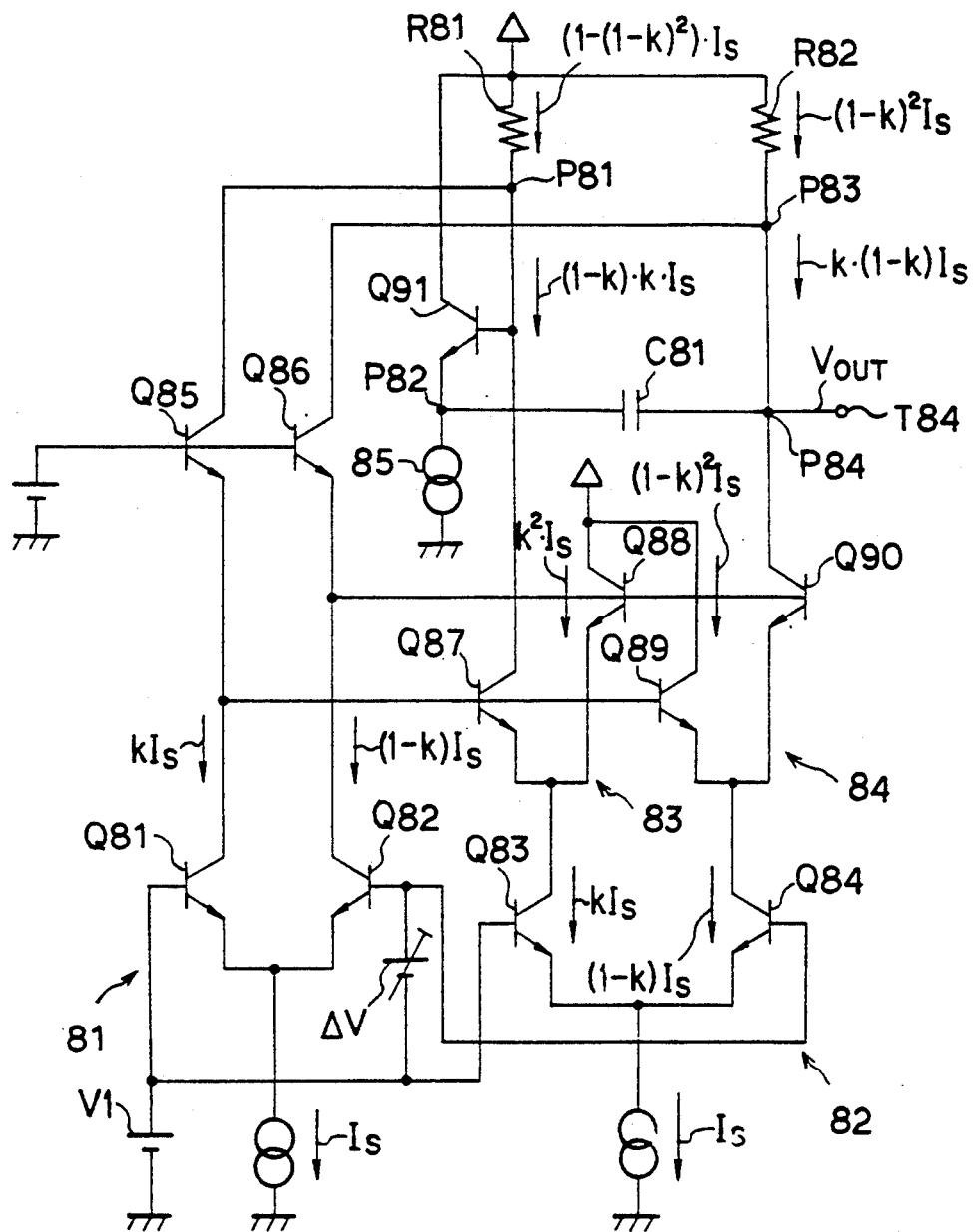
FIG. 17 is a connection diagram of a phase shift circuit as a fourth embodiment of the present invention.

Referring to FIG. 17, a fourth embodiment of the present invention will be described. In FIG. 17, the phase shift circuit 80 includes first and second differential amplification circuits 81 and 82. The first differential amplification circuit 81 is constituted by a pair of npn transistors Q81 and Q82 whereas the second differential amplification circuit 82 another pair of npn transistors Q83 and Q84. Common emitters of transistors Q81, Q82 and Q83, Q84 are provided with equal signal current Is. The bases of the transistors Q81 and Q83 are supplied with a bias voltage V1 while the bases of the transistors Q82 and Q84 a variable bias voltage (V1+$\Delta$V). Collector current k·Is which is k times as large as signal current Is flows through the transistors Q81 and Q83 whereas collector current $(1-k)$·Is which is $(1-k)$ times as large as the signal current Is flows through the transistors Q82 and Q84 ($0<k<1$).

Fixed bias transistors Q85 and Q86 are cascode connected to the collectors of the transistors Q81 and Q82. The collectors of the transistors Q83 and Q84 of the second differential amplification circuit 82 are connected to third and fourth differential amplification circuits 83 and 84, respectively. The third and fourth differential amplification circuits 83 and 84 are constituted by pairs of transistors Q87, Q88 and Q89, Q90, respectively. The transistors Q87 and Q89 are driven by a voltage of a connection node of the transistors Q81 and Q85 of the first differential amplification circuit 81. The transistors Q88 and Q90 are driven by a voltage of a connection node of the transistors Q82 and Q86 constituting the first differential amplification circuit 81.

Collector currents $(1-k)\cdot k\cdot Is$ and $k^2\cdot Is$ flow through the pair of transistors Q87 and Q88 of the third differential amplification circuit 83, respectively, the former collector current being divided from the signal current k·Is with a factor of $(1-k)$ whereas the latter is divided from the signal current k·Is with a factor of k.

Collector currents $(1-k)^2\cdot Is$ and $(1-k)\cdot k\cdot Is$ flow through the pair of transistors Q89 and Q90 of the fourth differential amplification circuit 84, respectively, the former collector current being divided from the signal current $(1-k)\cdot Is$ with a factor of $(1-k)$ whereas the latter is divided from the signal current $(1-k)$.Is with a factor of k.

The collectors of the transistors Q88 and Q89 are connected to the common voltage supply Vcc.

The transistor Q87 of the third differential amplification circuit 83 is connected at the collector thereof to the voltage supply Vcc through a resistance R81. A connection node P81 between the resistance R81 and the transistor Q87 is connected to the collector of the transistor Q85 of the first differential amplification circuit 81. Thus, sum current $(1-(1-K)^2)\cdot Is$ which flows through the transistors Q85 and Q87 flows through the resistance R81. A buffer transistor Q91 is connected to the connection node P81, and voltage $(1-(1-K)^2)\cdot Is\cdot R$ is developed at a connection node P82 between the transistor Q91 and the current source 85.

The transistor Q90 of the fourth differential amplification circuit 84 is connected at the collector thereof to the voltage supply Vcc through a resistance R82. A connection node P83 between the resistance R82 and the transistor Q90 is connected to the collector of the transistor Q86 of the first differential amplification circuit 81. Thus, sum current $(1-K^2)\cdot Is$ which flows through the transistors Q86 and Q90 flows through the resistance R82. A voltage $(1-K^2)\cdot Is\cdot R$ is therefore developed at a connection node P83.

A capacitor C81 is connected between the connection node P82 and a connection node P84 between the collector of the transistor Q90 and the resistance R82.

Figure 18:
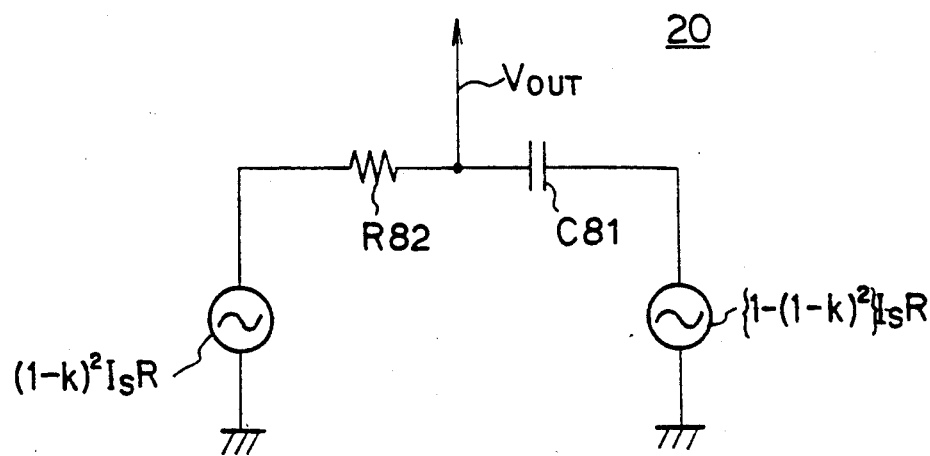
FIG. 18 is an equivalent circuit diagram of an essential portion of the phase shift circuit shown in FIG. 17.

The equivalent circuit of the phase shift circuit may be represented as in FIG. 18. A signal voltage $(1-(1-K)^2)\cdot Is\cdot R$ is developed at the collector of the transistor Q87 of the third differential amplification circuit 83, and lags by a phase angle of 45° by the capacitor C81 and the resistance R82. A signal voltage $(1-K^2)\cdot Is\cdot R$ is developed at the collector of the transistor Q90 of the fourth differential amplification circuit 84, and leads by 45°. These signals are vector composed to output a voltage as an output Vout of the phase shift circuit 80.

Figure 19:
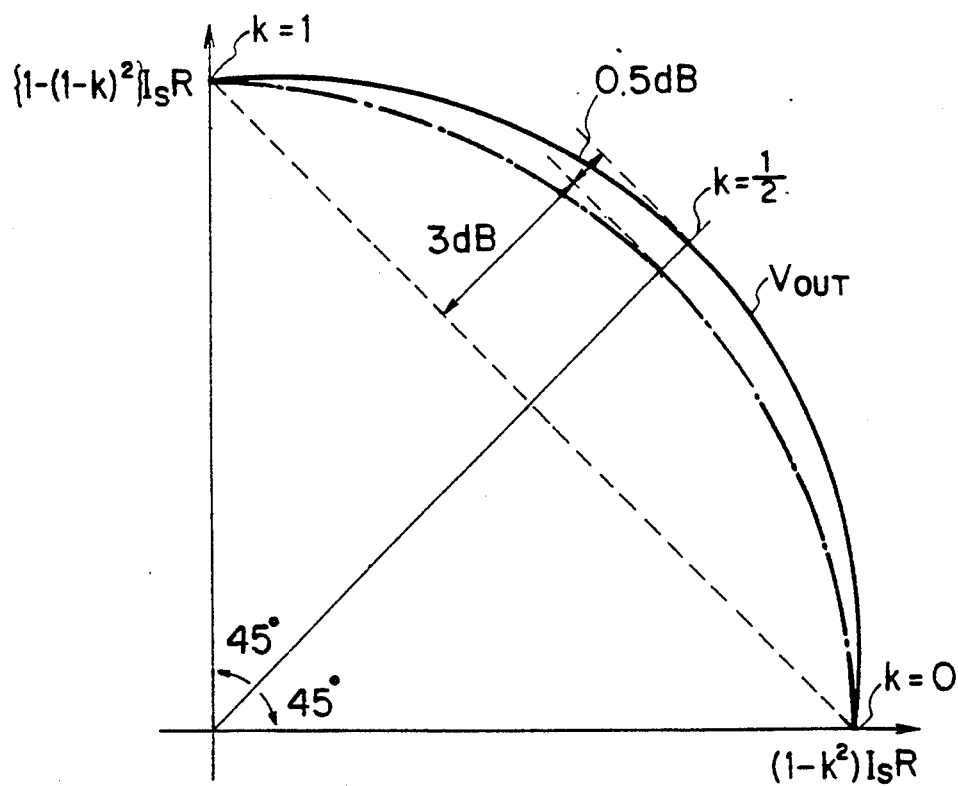
FIG. 19 is a characteristic graph showing the relationship between phase changes and output gain in an equivalent circuit of an essential portion of the phase shift circuit shown in FIG. 18.

In such a configuration, the phase shift circuit 80 inputs signal current Is to the common emitters of the first and second differential amplification circuits 81 and 82 from the voltage controlled oscillator 5 through the low pass filter 6 of FIG. 1. The phase shift circuit divides signal current Is at a ratio of $k:(1-k)$ at the transistor pair Q81 and Q82 of the first differential amplification circuit 81 and at the transistor pair Q83 and Q84 of the second differential amplification circuit 82. Furthermore, the phase shift circuit divides signal current k·Is at a ratio of $(1-k):k$ at the transistor pair Q87 and Q88 of the third differential amplification circuit 83, and signal current $(1-k)\cdot Is$ also at a ratio of $(1-k):k$ at the transistor pair Q89 and Q90 of the fourth differential amplification circuit 84. Voltages $(1-(1-k)^2)\cdot Is\cdot R$ and $(1-k) \cdot Is \cdot R$ are therefore developed at second and third connection nodes P82 and P83, respectively. The voltages $(1-(1-k) 2) \cdot Is \cdot R$ and $(1-k^2) \cdot Is \cdot R$ are in phase with the input signal current Is. The former leads by 45° and the latter lags by 45° due to the resistance R82 and the capacitor C81, and a vector sum of the 45° lead and 45° lag signal voltages is therefore developed at the output terminal T84. The gain of this output voltage Vout is shown as a locus indicated by the solid line in FIG. 19 when 45° lag signal voltage is plotted on x axis while 45° lead signal voltage is plotted on y axis.

Figure 5:
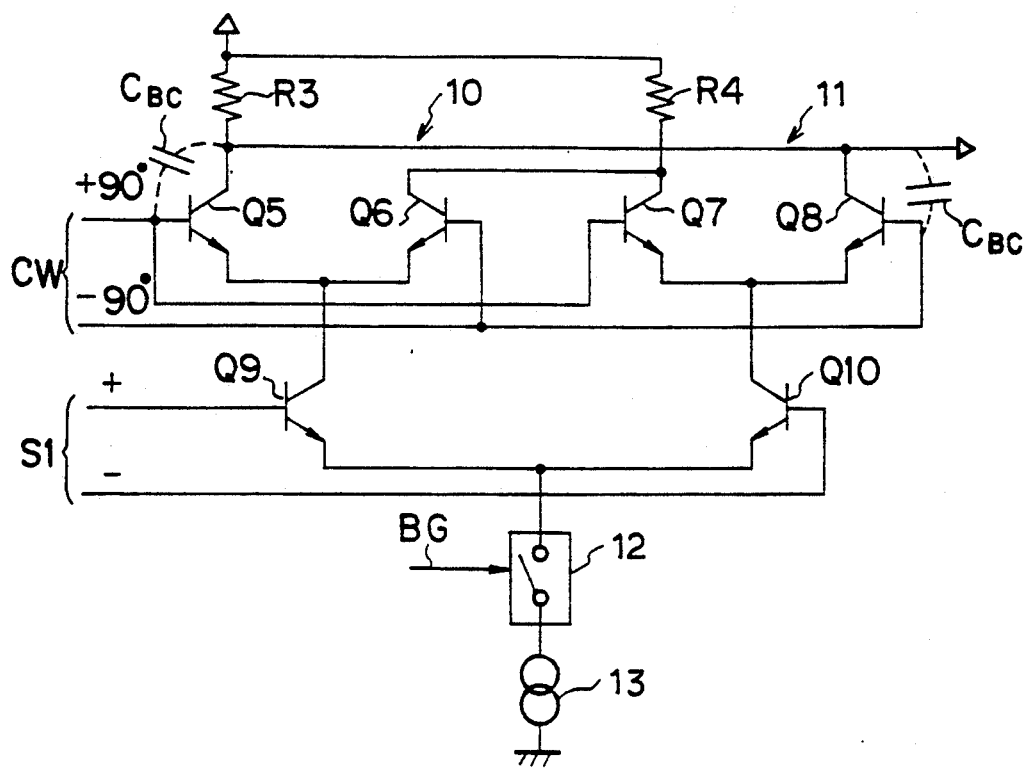
FIG. 5 is a connection diagram for illustrating the conventional multiplier circuit.
Figure 6:
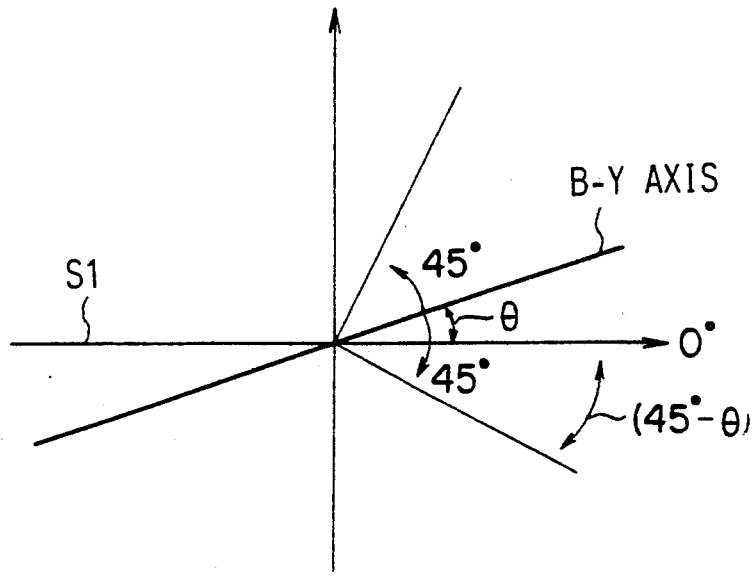
FIG. 6 is a characteristic graph for illustrating demodulation of chrominance signals, outputted from the automatic phase control circuit, along the B-Y axis.
Figure 7:
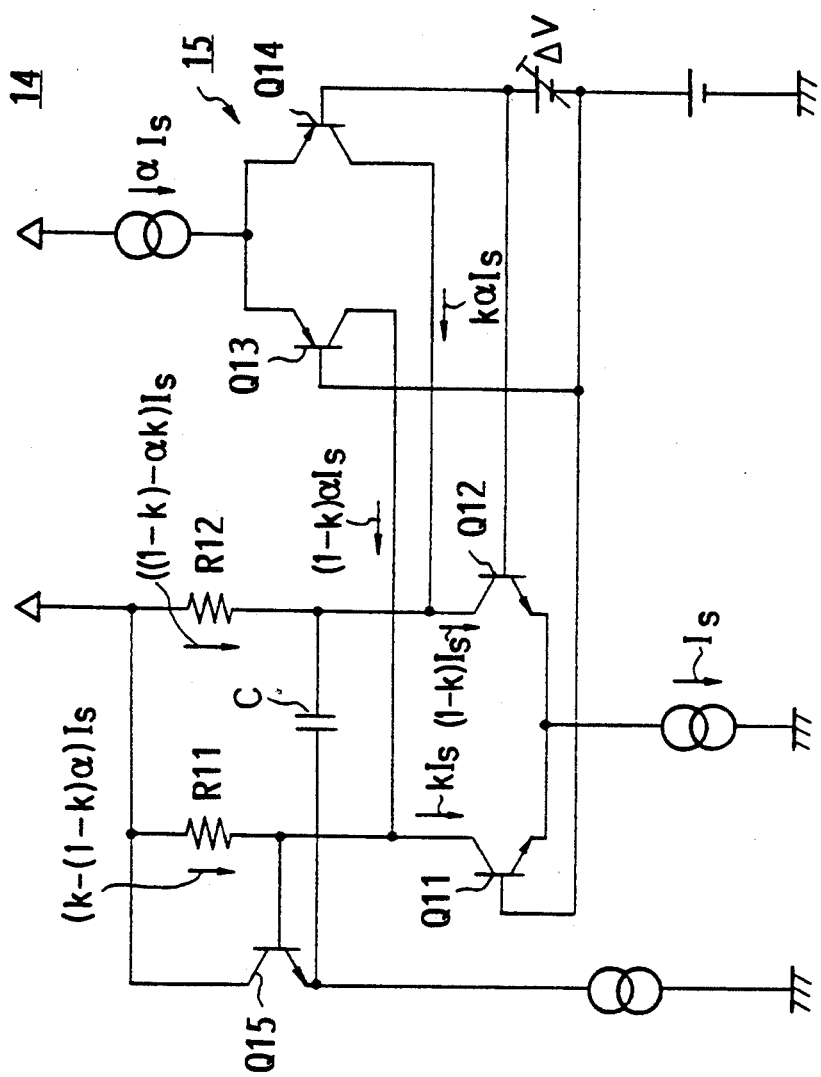
FIG. 7 is a connection diagram for illustrating a conventional phase shift circuit.
Figure 8:
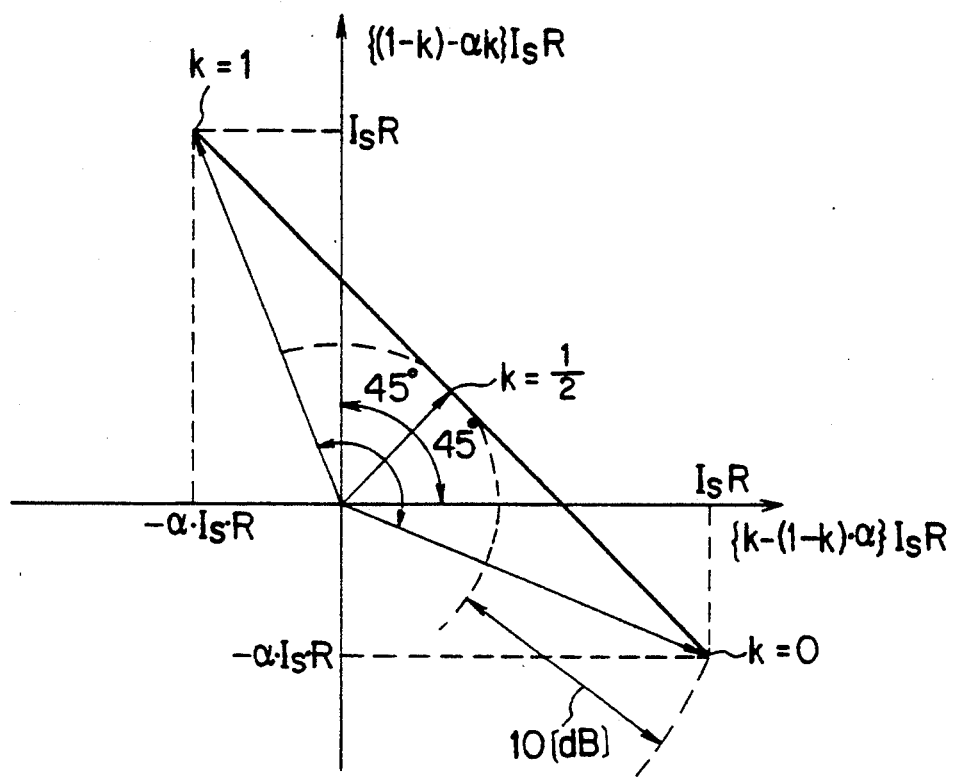
FIG. 8 is a characteristic graph for illustrating the operating of the conventional phase shift circuit shown in FIG. 7.

The output gain therefore becomes approximately equal to a gain in the case where the gain of the output voltage Vout is constant at any phase (shown by the broken line in FIG. 19), and in the case where maximum gain error is produced, that is ($k=\frac{1}{2}$), gain error is below 0.5 [dB], and can be remarkably reduced as compared to the prior art. This makes it possible to effectively avoid a disadvantage of the prior art such that in the case where the phase of a signal of which signal amplitude is set to the optimum amplitude is shifted, distortion is produced in the signal amplitude due to an increase in gain. Furthermore, another disadvantage such that distortion is produced in the output amplitude due to incidental capacity $C_{BC}$ of the collectors of transistors Q5 to Q8 which constitute the multiplier circuit 3, shown in FIG. 5, may be also effectively removed. Moreover, it is possible to effectively remove a possibility that in the case where the phase of a signal of which signal amplitude is set to the optimum amplitude is shifted, the operation of each of the transistors Q5 to Q8 of the multiplier circuit 3 becomes unstable since the gain decreases.

According to this embodiment, an output voltage Vout of the phase shift circuit is given by a vector sum of a voltage $(1-(1-k)^2)$ $Is \cdot R$ and a voltage $(1-k^2) \cdot Is \cdot R$, the former leading in phase the input signal by 45° while the latter lags by 45°. This enables that: in the case where the phase is shifted to a predetermined value, the output gain is kept substantially constant; the multiplier circuit 3 of the automatic phase control circuit is much reduced in error as compared to multiplier circuits of the prior art; and exact demodulation axes, B-Y axis and R-Y axis, are provided to burst signals.

In the fourth embodiment, the first differential amplification circuit 81 is connected to the connection nodes P81 and P83, and currents k·Is and $(1-k) \cdot Is$ which are produced by dividing signal current Is at a ratio $k:(1-k)$ flow into the connection nodes P81 and P83, respectively. The present invention is not limited to such a case, and may be applied to various cases where currents K·Is and $(1-k) \cdot Is$ are caused to flow through other differential amplification means.

Figure 20:
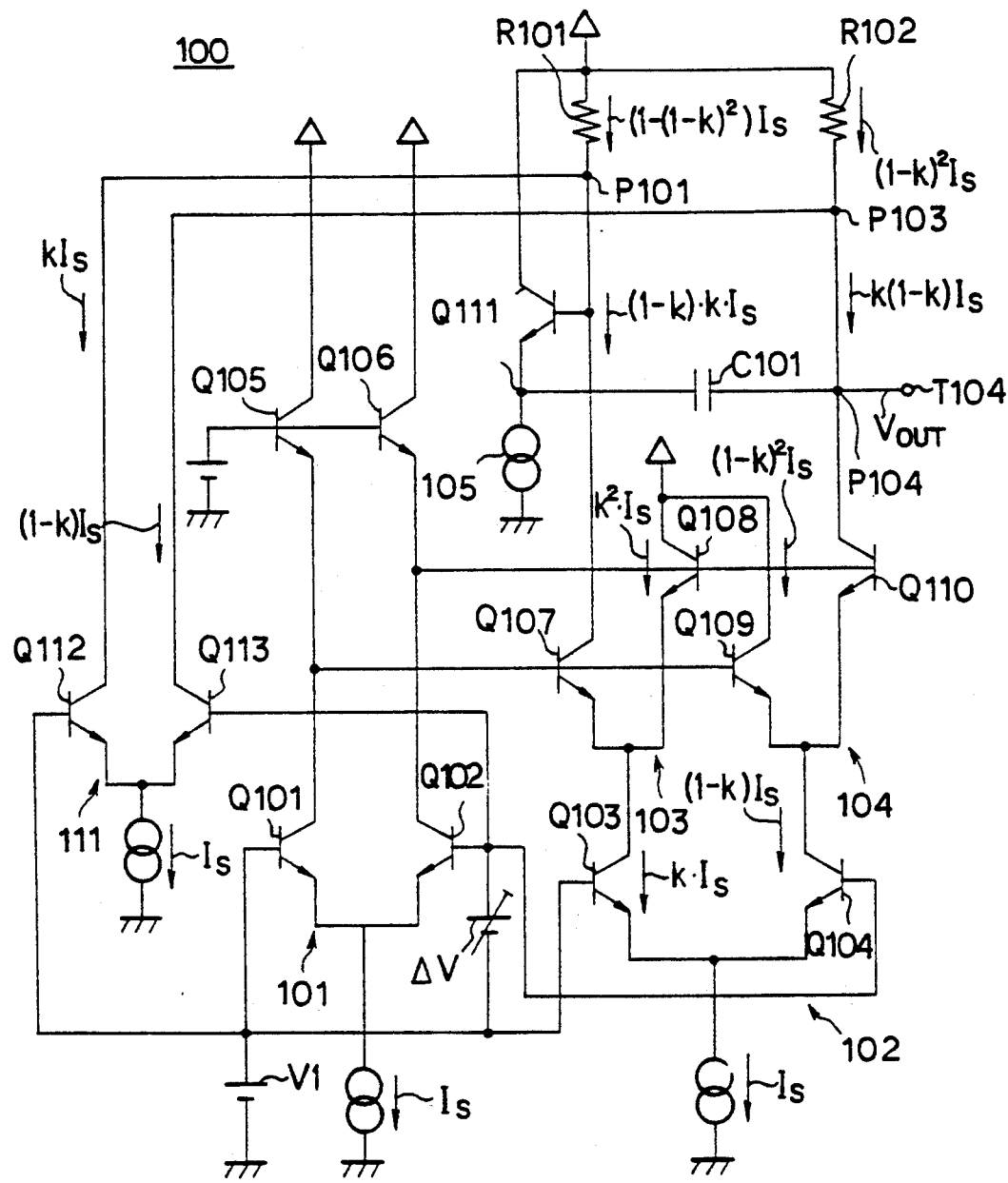
FIG. 20 is a diagram of a phase shift circuit as a fifth embodiment of the present invention.

As shown in FIG. 20 with addition to the configuration of FIG. 17, the phase shift circuit 100 includes a differential amplification circuit 111, which is constituted by a pair of transistors Q112 and Q113. The collectors of the transistors Q112 and Q113 are connected to connection nodes P101 and P103, respectively. The bases of the transistors Q112 and Q113 are supplied with variable voltage $(V1+\Delta V)$ and bias voltage V1, respectively, and the common emitters thereof are provided with signal current Is.

In this embodiment, the collectors of transistors Q105 and Q106 which are cascode connected to a first differential amplification circuit 101 are connected to voltage sources in place of branch nodes P101 and P103. As in the preceding embodiments, at the output terminal T104 there is developed an output voltage which is given by a vector sum of a voltage $(1-(1-k)2) \cdot Is \cdot R$ and a voltage $(1-k^2) \cdot Is \cdot R$, the former lagging in phase the input signal by 45° while the latter leads by 45°. The same effect as that of the preceding embodiments may be therefore achieved.

In the embodiments previously described, chrominance signals are phase controlled in automatic phase control circuits, but the present invention may be applied to various phase shift circuits which achieve variable phase control of other kinds of signals.

In the fourth embodiment, the capacitor C101 is connected between the output terminal T104 and the connection node 102, but the present invention may be applied to a case where other phase elements are connected.

In the embodiments previously described, the present invention is applied to phase shift circuits having configurations shown in FIGS. 17 and 20, but the present invention may be widely applied to phase shift circuits which are capable of providing output containing a square component.

According to the present invention, first and second currents which have been produced by dividing signal current at a predetermined ratio by a variable bias voltage are respectively supplied to fifth and eighth transistors which constitute the second differential amplification means, and the first and the second currents are respectively divided at predetermined ratios to supply currents, including square components; third, fourth, fifth and sixth currents which are caused to flow through fifth and sixth transistors of the third differential amplification means and seventh and eighth transistors of the fourth differential amplification means, respectively. Seventh and eighth currents which have been produced by dividing signal current at predetermined ratios are supplied to the ninth and the tenth transistors or the eleventh and the twelfth transistors from the first and the second connection nodes, respectively. In this event, currents which are first and second divided sum currents including square components at predetermined ratio are provided to the first and the second load resistances, and therefore at the fourth connection node there is developed an output voltage by composing the first connection node voltage, which leads the input signal by a phase angle of 45°, with the second connection node voltage which lags the input signal by a phase angle of 45°, and the gain of the output is substantially constant within a variable range of phase.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A phase shift circuit apparatus comprising:
    first differential amplification means including first and second transistors having common emitters for receiving an input signal;
    second differential amplification means including third and fourth transistors having common emitters for receiving the input signal;
    third differential amplification means including fifth and sixth transistors having common emitters connected to a collector of the third transistor of the second differential amplification means;

fourth differential amplification means including seventh and eighth transistors having common emitters connected to a collector of the fourth transistor of the second differential amplification means;

a first load resistance connected to the fifth transistor;

a second load resistor connected to the eighth transistor, the first and second load resistances being connected to a reference voltage source;

fifth differential amplification means including ninth and tenth transistors having common emitters to be draw a current at predetermined times as large as the input signal, the ninth and tenth transistors having collectors connected to respective connection nodes between the third differential amplification means and the third transistor and between the fourth differential amplification means and the fourth transistor for producing a negative signal voltage;

an eleventh transistor cascode connected to-a collector of the first transistor, and connected to a third connection node between the first load resistance and the fifth transistor;

a twelfth transistor cascode connected to a collector of the second transistor, and connected to a fourth connection node between the second load resistance and the eighth transistor;

a buffer transistor having a base connected to a fifth connection node between the third connection node and the fifth transistor, the buffer transistor having an emitter connected to a current source; and a phase element having one terminal connected to a sixth connection node between the buffer transistor and the current source, the other terminal thereof connected to a seventh connection node between the sixth connection node and the eighth transistor; and wherein:

the first, the third and the ninth transistors are driven by a predetermined bias voltage;

the second, the fourth and the tenth transistors are driven by a variable bias voltage;

the fifth and the seventh transistors are driven by a voltage at a connection node between the first and the eleventh transistors;

the sixth and the eighth transistors are driven by a voltage at a connection node between the second and the twelfth transistors; and the input signal provided to the first and the second differential amplification means is outputted from the seventh connection node with its phase shifted.

2. A phase shift circuit apparatus comprising:

first differential amplification means including first and second transistors having common emitters for receiving an input signal;

second differential amplification means including third and fourth transistors having common emitters for receiving the input signal;

third differential amplification means including fifth and sixth transistors having common emitters connected to a collector of the third transistor of the second differential amplification means;

fourth differential amplification means including seventh and eighth transistors having common emitters connected to a collector of the fourth transistor of the second differential amplification means;

a first load resistance connected to the fifth transistor;

a second load resistance connected to the eighth transistor, the first and second load resistance being connected to a reference voltage source;

fifth differential amplification means for producing negative signal voltages and including ninth and tenth transistors having common emitters for receiving signals at predetermined times as large as the input signal, the ninth and tenth transistors having collectors connected to the reference voltage source through first and second constant current sources, a first connection node between the first constant current source and the collector of the ninth transistor being connected to a connection node between the third differential amplification means and the third transistor whereas a second connection node between the second constant current source and the collector of the tenth transistor is connected to a connection node between the fourth differential amplification means and the fourth transistor;

an eleventh transistor cascode connected to a collector of the first transistor, and connected to a fifth connection node between the first load resistance and the fifth transistor;

a twelfth transistor cascode connected to a collector of the second transistor, and connected to a sixth connection node between the second load resistance and the eighth transistor;

a buffer transistor having a base connected to a seventh connection node between the third connection node and the fifth transistor, the buffer transistor having an emitter connected to a current source; and a phase element having one terminal connected to an eighth connection node between the buffer transistor and the current source, the other terminal thereof connected to a ninth connection node between the sixth connection node and the eighth transistor; and wherein:

the first, the third and the ninth transistors are driven by a predetermined bias voltage;

the second, the fourth and the tenth transistors are driven by a variable bias voltage;

the fifth and the seventh transistors are driven by a voltage at a connection node between the first and the eleventh transistors;

the sixth and the eighth transistors are driven by a voltage at a connection node between the second and the twelfth transistors; and the input signal provided to the first and the second differential amplification means is outputted from the ninth connection node with its phase shifted.

3. A phase shift circuit apparatus according to claim 1 or 2, further comprising:

quartz oscillation means including a quartz oscillator and connected to the first, the second, and the fifth differential amplification means, for supplying oscillated output, as the input signal, from the quartz oscillator; and filtering means for outputting an output voltage; and wherein:

the variable bias voltage is controlled on the basis of the output voltage from the filtering means so that the oscillation frequency of the quartz oscillator is controlled to a predetermined frequency.

4. A phase shift circuit apparatus comprising:

first differential amplification means including first and second transistors having common emitters for receiving an input signal;

second differential amplification means including third and fourth transistors having common emitters for receiving the input signal;

third differential amplification means including fifth and sixth transistors having common emitters connected to a collector of the third transistor of the second differential amplification means;

fourth differential amplification means including seventh and eighth transistors having common emitters connected to a collector of the fourth transistor of the second differential amplification means;

a first load resistance connected to the fifth transistor;

a second load resistance connected to the eighth transistor, the first and second load resistances being connected to a reference voltage source;

a ninth transistor cascode connected to a collector of the first transistor, and connected to a first connection node between the first load resistance and the fifth transistor;

a tenth transistor cascode connected to a collector of the second transistor, and connected to a second connection node between the second load resistance and the eighth transistor;

a buffer transistor having a base connected to the first connection node and having an emitter connected to a current source; and a phase element having one terminal connected to third connection node between the buffer transistor and the current source, the other terminal thereof connected to a fourth connection node between the second connection node and the eighth transistor; and wherein:

the first and the third transistors driven by a predetermined bias voltage;

the second and the fourth transistors driven by a variable bias voltage;

the fifth and the seventh transistors are driven by a voltage at a connection node between the first and the ninth transistors;

the sixth and the eighth transistors are driven by a voltage at a connection node between the second and the tenth transistors; and the input signal provided to the first and the second differential amplification means is outputted from the fourth connection node with its phase shifted.

5. A phase shift circuit apparatus comprising:

first differential amplification means including first and second transistors having common emitters for receiving an input signal;

second differential amplification means including third and fourth transistors having common emitters for receiving the input signal;

third differential amplification means including fifth and sixth transistors having common emitters connected to a collector of the third transistor of the second differential amplification means;

fourth differential amplification means including seventh and eighth transistors having common emitters connected to a collector of the fourth transistor of the second differential amplification means;

a first load resistance connected to the fifth transistor;

a second load resistance connected to the eighth transistor, the first and second load resistances being connected to a reference voltage source;

a ninth transistor cascode connected to a collector of the first transistor, and connected to the reference voltage source;

a tenth transistor cascode connected to a collector of the second transistor, and connected to the reference voltage source;

fifth differential amplification means including eleventh and twelfth transistors having common emitters for receiving the input signal, the eleventh transistor having a collector connected to a first connection node between the first load resistance and the fifth transistor whereas the twelfth transistor includes a collector connected to a second connection node between the second load resistance and the eighth transistor;

a buffer transistor having a base connected to the first connection node, the buffer transistor having an emitter connected to a current source; and a phase element having one terminal connected to a third connection node between the buffer transistor and the current source, the other terminal thereof connected to a fourth connection node between the second connection node and the eighth transistor; and wherein:

the first, the third and the eleventh transistors being are driven by a predetermined bias voltage;

the second, the fourth and the twelfth transistors are driven by a variable bias voltage;

the fifth and the seventh transistors are driven by a voltage at a connection node between the first and the ninth transistors;

the sixth and the eighth transistors are driven by a voltage at a connection node between the second and the tenth transistors; and the input signal provided to the first and the second differential amplification means is outputted from the fourth connection node with its phase shifted.

* * * * *